(12) United States Patent
Scheller et al.

(10) Patent No.: US 11,749,964 B2
(45) Date of Patent: Sep. 5, 2023

(54) MONOLITHIC LIGHT SOURCE WITH INTEGRATED OPTICS BASED ON NONLINEAR FREQUENCY CONVERSION

(71) Applicant: Meta Platforms Technologies, LLC, Menlo Park, CA (US)

(72) Inventors: Maik Andre Scheller, Redmond, WA (US); Anurag Tyagi, Kirkland, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 302 days.

(21) Appl. No.: 16/911,294

(22) Filed: Jun. 24, 2020

(65) Prior Publication Data
US 2021/0408761 A1 Dec. 30, 2021

(51) Int. Cl.
*H01S 5/00* (2006.01)
*H01S 5/06* (2006.01)
(Continued)

(52) U.S. Cl.
CPC .......... *H01S 5/0604* (2013.01); *H01S 5/0657* (2013.01); *H01S 5/141* (2013.01);
(Continued)

(58) Field of Classification Search
CPC ...... H01S 5/0604; H01S 5/0657; H01S 5/141; H01S 5/18311; H01S 5/1833;
(Continued)

(56) References Cited

U.S. PATENT DOCUMENTS

| 5,493,577 A | 2/1996 | Choquette et al. |
| 5,881,085 A * | 3/1999 | Jewell ...................... G02B 3/00 372/50.23 |

(Continued)

FOREIGN PATENT DOCUMENTS

WO 2006105249 A2 10/2006

OTHER PUBLICATIONS

US Non-Final Office Action dated Oct. 1, 2020 in U.S. Appl. No. 16/692,648.
(Continued)

*Primary Examiner* — Kinam Park
(74) *Attorney, Agent, or Firm* — Weaver Austin Villeneuve & Sampson LLP

(57) ABSTRACT

A semiconductor light source including a planar optical component that focuses long-wavelength (e.g., infrared) light emitted in a resonant cavity into a nonlinear crystal, which then converts the long-wavelength light into light having a shorter wavelength (e.g., visible light) by frequency doubling. A wavelength-selective reflection layer on the nonlinear crystal reflects the long-wavelength light back into the resonant cavity to form an external cavity and transmits the light having the shorter wavelength out of the external cavity. The resonant cavity includes an active region that emits the long-wavelength light at a high efficiency. The planar optical component includes a micro-lens formed in semiconductor layers or a gradient refractive index lens formed in the nonlinear crystal.

17 Claims, 25 Drawing Sheets

(51) Int. Cl.
- *H01S 5/065* (2006.01)
- *H01S 5/14* (2006.01)
- *H01S 5/42* (2006.01)
- *H01S 5/20* (2006.01)
- *H01S 5/183* (2006.01)
- *H01S 5/34* (2006.01)

(52) U.S. Cl.
CPC ........ *H01S 5/1833* (2013.01); *H01S 5/18311* (2013.01); *H01S 5/18333* (2013.01); *H01S 5/18336* (2013.01); *H01S 5/2086* (2013.01); *H01S 5/423* (2013.01); *H01S 5/14* (2013.01); *H01S 5/18388* (2013.01); *H01S 5/34* (2013.01)

(58) Field of Classification Search
CPC ............. H01S 5/18333; H01S 5/18336; H01S 5/2086; H01S 5/423; H01S 5/14; H01S 5/18388; H01S 5/34

See application file for complete search history.

(56) References Cited

U.S. PATENT DOCUMENTS

| | | | |
|---|---|---|---|
| 6,317,446 | B1 | 11/2001 | Wipiejewski |
| 8,031,752 | B1 | 10/2011 | Johnson et al. |
| 8,189,642 | B1 | 5/2012 | Li et al. |
| 9,337,621 | B2 | 5/2016 | Kaneko et al. |
| 11,099,393 | B2 | 8/2021 | Scheller et al. |
| 2004/0136433 | A1* | 7/2004 | Kuznetsov .......... H01S 5/18388 372/92 |
| 2006/0023757 | A1 | 2/2006 | Mooradian et al. |
| 2006/0078027 | A1 | 4/2006 | Kim |
| 2006/0198404 | A1* | 9/2006 | Henrichs ............. H01S 5/18391 372/100 |
| 2009/0262765 | A1 | 10/2009 | Chang et al. |
| 2009/0304039 | A1* | 12/2009 | Lutgen .................... H01S 5/141 438/31 |
| 2011/0148328 | A1* | 6/2011 | Joseph ..................... F21K 9/00 315/312 |
| 2012/0134382 | A1 | 5/2012 | Mayer et al. |
| 2016/0352071 | A1 | 12/2016 | Hogan et al. |
| 2016/0352074 | A1 | 12/2016 | Hogan et al. |
| 2017/0063040 | A1 | 3/2017 | Su et al. |
| 2017/0098741 | A1 | 4/2017 | Lee |
| 2018/0174833 | A1 | 6/2018 | Meyer et al. |
| 2018/0175262 | A1 | 6/2018 | Jansen et al. |
| 2018/0273372 | A1 | 9/2018 | Piechocinski |
| 2019/0020858 | A1* | 1/2019 | Pappas .................. G02B 27/01 |
| 2019/0089127 | A1 | 3/2019 | Gazula et al. |
| 2019/0148592 | A1 | 5/2019 | Takeuchi et al. |
| 2019/0156721 | A1 | 5/2019 | Blank et al. |
| 2019/0212482 | A1 | 7/2019 | Richards |
| 2020/0169062 | A1* | 5/2020 | Yuen ................... H01S 5/18311 |

OTHER PUBLICATIONS

US Final Office Action dated Jan. 26, 2021 in U.S. Appl. No. 16/692,648.

Geib, et al., "Fabrication Issues of Oxide-Confined VCSELs", Proceedings, vol. 3003, Vertical-Cavity Surface-Emitting Lasers, Apr. 4, 1997, pp. 69-74.

Hawkins, et al., "Reliability of Various Size Oxide Aperture VCSELs", 52nd Electronic Components and Technology Conference, Feb. 2002, pp. 540-550.

Stewart, et al., "Chemical Etching of (AlxGa1-x)0.5In0.5P Using Sulfuric and Hydrochloric Acids", Journal of the Electrochemical Society, vol. 139, No. 4, Apr. 1992, pp. 1217-1219.

International Search Report and Written Opinion for International Application No. PCT/US2021/032654 dated Sep. 20, 2021, 11 pages.

Notice of Allowance dated Apr. 19, 2021 for U.S. Appl. No. 16/692,648, filed Nov. 22, 2019, 8 pages.

\* cited by examiner

1900

```
┌─────────────────────────────────────────────────────────────────────┐
│ Deposit a stack of semiconductor layers on a substrate, the stack of │
│ semiconductor layers forming a resonant cavity and including a       │
│ plurality of semiconductor layers having different compositions and  │
│ susceptible to different oxidation (or etch) rates                   │
│                              1910                                    │
└─────────────────────────────────────────────────────────────────────┘
                                  ↓
┌─────────────────────────────────────────────────────────────────────┐
│ Etch the semiconductor layers to expose sidewalls of the plurality   │
│                       of semiconductor layers                        │
│                              1920                                    │
└─────────────────────────────────────────────────────────────────────┘
                                  ↓
┌─────────────────────────────────────────────────────────────────────┐
│ Laterally oxidize (or etch) the plurality of semiconductor layers    │
│                    from the exposed sidewalls                        │
│                              1930                                    │
└─────────────────────────────────────────────────────────────────────┘
                                  ↓
┌─────────────────────────────────────────────────────────────────────┐
│    Couple a nonlinear crystal to the stack of semiconductor layers   │
│                              1940                                    │
└─────────────────────────────────────────────────────────────────────┘
                                  ↓
┌─────────────────────────────────────────────────────────────────────┐
│       Deposit a selective reflection layer on the nonlinear crystal  │
│                              1950                                    │
└─────────────────────────────────────────────────────────────────────┘
                                  ↓
┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐
│       Form an array of microlenses on the selective reflection layer │
│                              1960                                    │
└ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘
```

FIG. 19

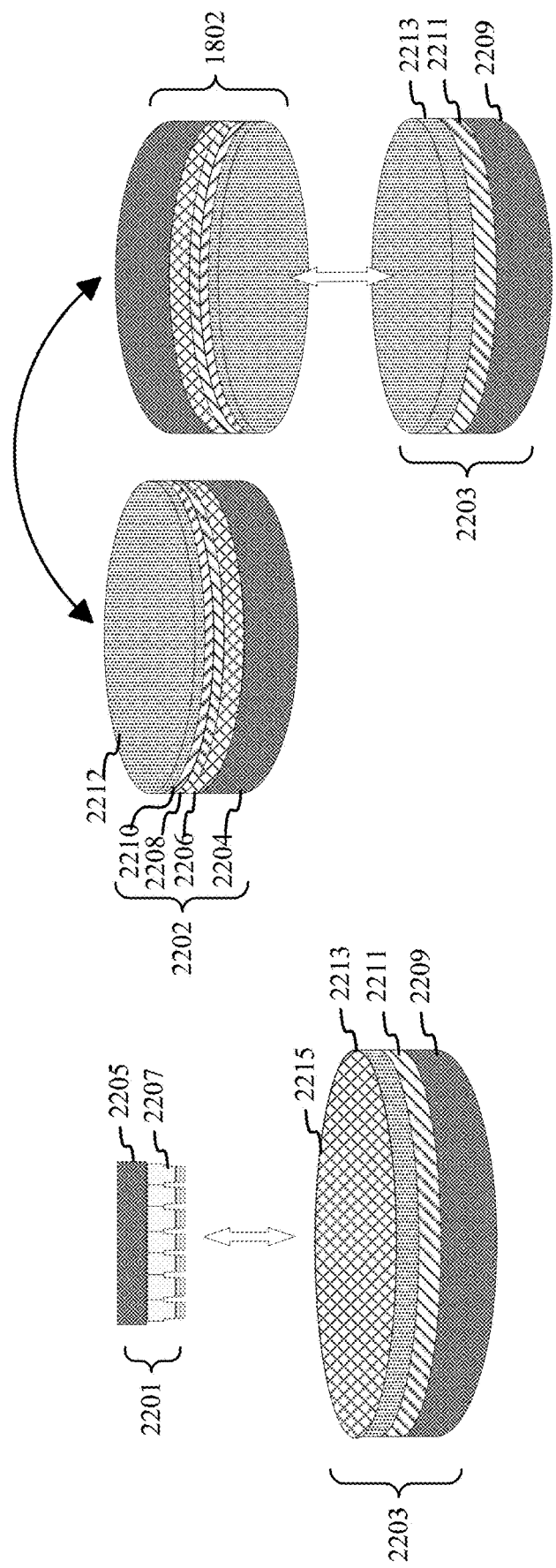

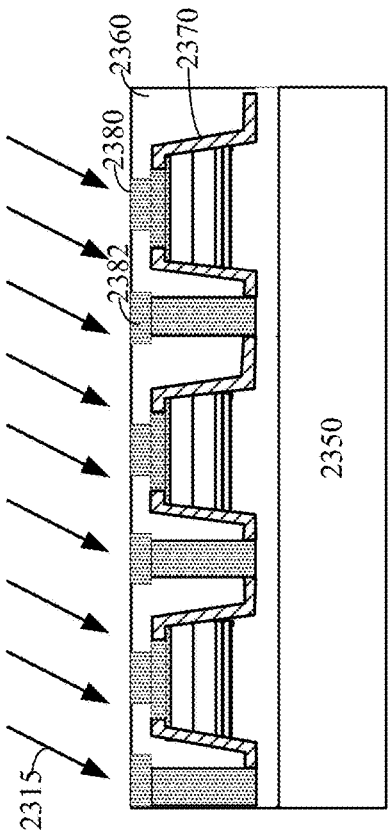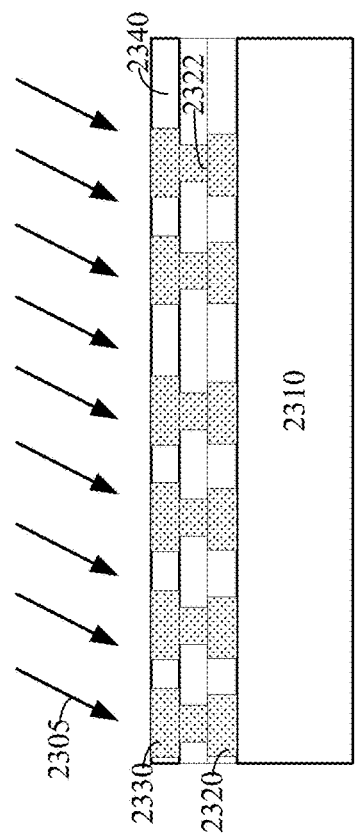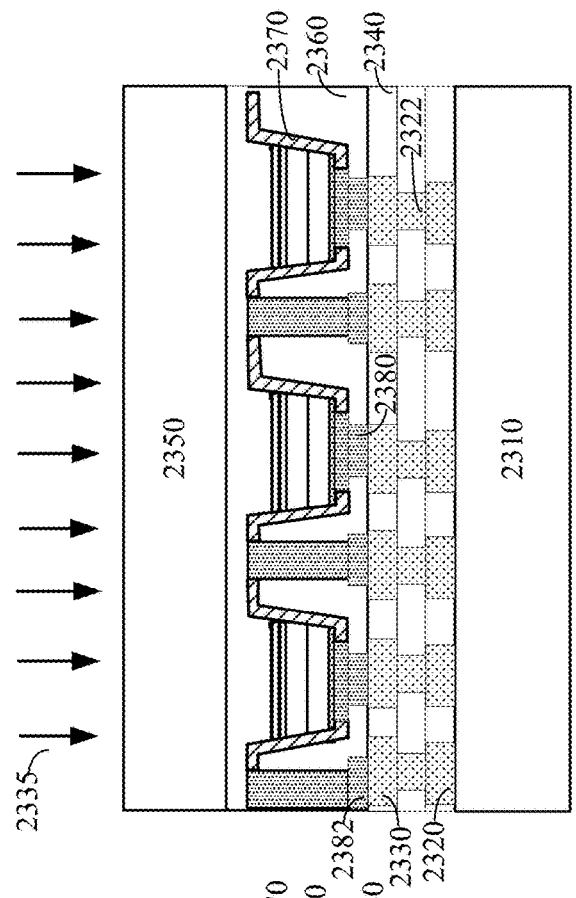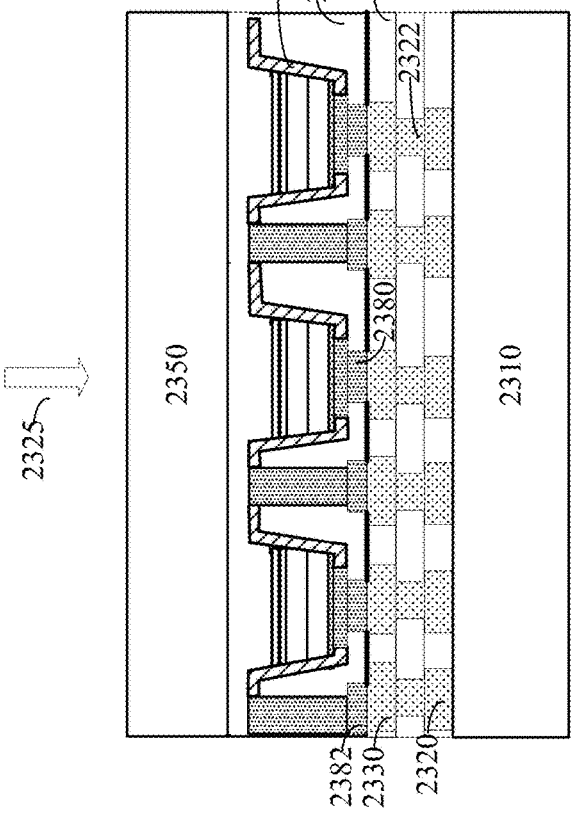

MONOLITHIC LIGHT SOURCE WITH INTEGRATED OPTICS BASED ON NONLINEAR FREQUENCY CONVERSION

BACKGROUND

Semiconductor light emitting devices, such as light emitting diodes (LEDs), micro-LEDs, resonant cavity LEDs (RCLEDs), vertical cavity surface emitting lasers (VCSELs), and vertical external cavity surface emitting lasers (VECSELs), convert electrical energy into optical energy, and offer many benefits over other light sources, such as reduced size, improved durability, and increased efficiency. Semiconductor light emitting devices can be used as light sources in many display systems, such as televisions, computer monitors, laptop computers, tablets, smartphones, projection systems, and wearable electronic devices. For example, micro-LEDs or VCSELs that emit light of different colors (e.g., red, green, and blue) can be used to form the sub-pixels of a display system, such as a near-eye display system. Micro-LEDs that emit infrared light can be used to illuminate eyes for eye tracking. Micro-LEDs, VCSELs, and other semiconductor light emitting devices can also be deployed in various sensor systems, such as systems for depth sensing, three-dimensional sensing, object tracking (e.g., hand tracking or face tracking), and the like.

SUMMARY

This disclosure relates generally to semiconductor light emitting devices. More specifically, and without limitation, this disclosure relates to a semiconductor light emitting device including an active region that emits light in a longer wavelength (e.g., near-infrared or infrared band) with a high efficiency, and a planar optical component that focuses the light in the longer wavelength into a second harmonic generation (SHG) crystal, which may then convert the light in the longer wavelength into light having a shorter wavelength (e.g., visible light). The planar optical component may include, for example, a micro-lens formed in semiconductor layers or a gradient refractive index (GRIN) lens formed in the SHG crystal. The planar optical component can be manufactured using semiconductor processing techniques, such as epitaxial growth and lateral oxidation or wet etching. Various inventive embodiments are described herein, including devices, systems, methods, materials, processes, and the like.

According to some embodiments, a semiconductor light source may include a resonant cavity including a first mirror and a second mirror, where the first mirror and the second mirror may each include a respective set of semiconductor layers. The semiconductor light source may also include a semiconductor light emitting region in the resonant cavity and coupled to at least one of the first mirror or the second mirror, where the semiconductor light emitting region may be configured to emit infrared light. The semiconductor light source may further include a planar lens including a plurality of semiconductor layers and configured to focus the infrared light emitted from the semiconductor light emitting region, a nonlinear crystal configured to convert the infrared light focused by the planar lens into visible light through second harmonic generation, and a selective reflection layer on the nonlinear crystal. The selective reflection layer may be configured to reflect the infrared light back into the resonant cavity to form an external cavity (with the second mirror), and to transmit the visible light out of the semiconductor light source.

In some embodiments of the semiconductor light source, the planar lens may be in the resonant cavity. In some embodiments, the planar lens may be between the resonant cavity and the nonlinear crystal, or may be a gradient refractive index (GRIN) lens formed in the nonlinear crystal. In some embodiments, the resonant cavity and the semiconductor light emitting region in the resonant cavity may form a mode-locked laser that can emit short pulses of light.

In some embodiments, each semiconductor layer of the plurality of semiconductor layers may include a first lateral region and a second lateral region, where the first lateral region and the second lateral region may be characterized by different respective refractive indices. The first lateral region in each semiconductor layer of the plurality of semiconductor layers may be characterized by a different lateral dimension. In some embodiments, the second lateral region may include an oxide region, an air gap, or a filling material, whereas the first lateral region may include an unoxidized semiconductor region.

In some embodiments, the first lateral region in each semiconductor layer of the plurality of semiconductor layers may include a first semiconductor material with a different respective composition. The first semiconductor material with the different respective composition in each semiconductor layer of the plurality of semiconductor layers may be characterized by a different respective lateral oxidation rate or lateral etch rate. In some embodiments, the first lateral region in each semiconductor layer of the plurality of semiconductor layers may include $Al_xGa_{1-x}As$ and may be characterized by a different respective x value that is greater than 0.7. In some embodiments, the first lateral region in each semiconductor layer of the plurality of semiconductor layers may include $(Al_xGa_{1-x})_{0.5}In_{0.5}P$ and may be characterized by a different respective x value.

In some embodiments, the plurality of semiconductor layers may be in adjacent epitaxial layers. In some embodiments, the plurality of semiconductor layers may be interleaved with a plurality of interlayers that include a second semiconductor material. In some embodiments, the plurality of semiconductor layers and the plurality of interlayers may form an antireflection structure.

In some embodiments, the first mirror may include a first distributed Bragg reflector characterized by a first reflectivity, and the second mirror may include a second distributed Bragg reflector characterized by a second reflectivity lower than the first reflectivity. In some embodiments, the nonlinear crystal may include $LiNbO_3$, $KNbO_3$, KTP, BBO, KDP, LBO, KTO, or BTO. In some embodiments, the semiconductor light source may include a micro-lens on the selective reflection layer.

In some embodiments, the semiconductor light emitting region may include a first cladding layer, a second cladding layer, and a light emission layer between the first cladding layer and the second cladding layer. The light emission layer may include a quantum dot structure, a quantum well structure, or a multiple-quantum-well structure.

According to certain embodiments, a visible light source may include an array of semiconductor light sources. Each semiconductor light source of the array of semiconductor light sources may include a first set of semiconductor layers forming a first mirror and a second set of semiconductor layers forming a second mirror, where the second mirror and the first mirror may form a resonant cavity. The semiconductor light source may include a light emitting region positioned between the first set of semiconductor layers and the second set of semiconductor layers and configured to emit light in a first wavelength, a planar lens including a plurality of semiconductor layers and configured to focus the light in the first wavelength emitted by the light emitting region, a nonlinear crystal configured to convert the light in the first wavelength and focused by the planar lens into light in a second wavelength that is a half of the first wavelength, and a selective reflection layer on the nonlinear crystal. The selective reflection layer may be configured to reflect the light in the first wavelength back into the resonant cavity to form an external cavity, and to transmit the light in the second wavelength out of the semiconductor light source.

According to certain embodiments, a method may include depositing a stack of semiconductor layers on a substrate. The stack of semiconductor layers may include a first set of semiconductor layers forming a first mirror, a second set of semiconductor layers forming a second mirror, a light emitting region between the first set of semiconductor layers and the second set of semiconductor layers and configured to emit infrared light, and a third set of semiconductor layers. The second mirror and the first mirror may form a resonant cavity. Each semiconductor layer in the third set of semiconductor layers may include a first semiconductor material with a different respective composition and characterized by a different respective lateral oxidation or etch rate. The method may also include etching the stack of semiconductor layers vertically to expose sidewalls of the third set of semiconductor layers, oxidizing or etching the third set of semiconductor layers laterally from the sidewalls for a period of time, coupling a nonlinear second harmonic generation crystal to the stack of semiconductor layers, and coating a wavelength-selective reflection layer on the nonlinear second harmonic generation crystal. The wavelength-selective reflection layer may be configured to reflect the infrared light back into the resonant cavity to form an external cavity, and to transmit visible light out of the external cavity.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 19 is a flowchart illustrating an example of a process of fabricating a visible light emitter array according to certain embodiments.

FIG. 22A illustrates an example of a method of die-to-wafer bonding for arrays of semiconductor light sources according to certain embodiments. FIG. 22B illustrates an example of a method of wafer-to-wafer bonding for arrays of semiconductor light sources according to certain embodiments.

FIGS. 23A-23D illustrates an example of a method of hybrid bonding for arrays of semiconductor light sources according to certain embodiments.

Figure 1:
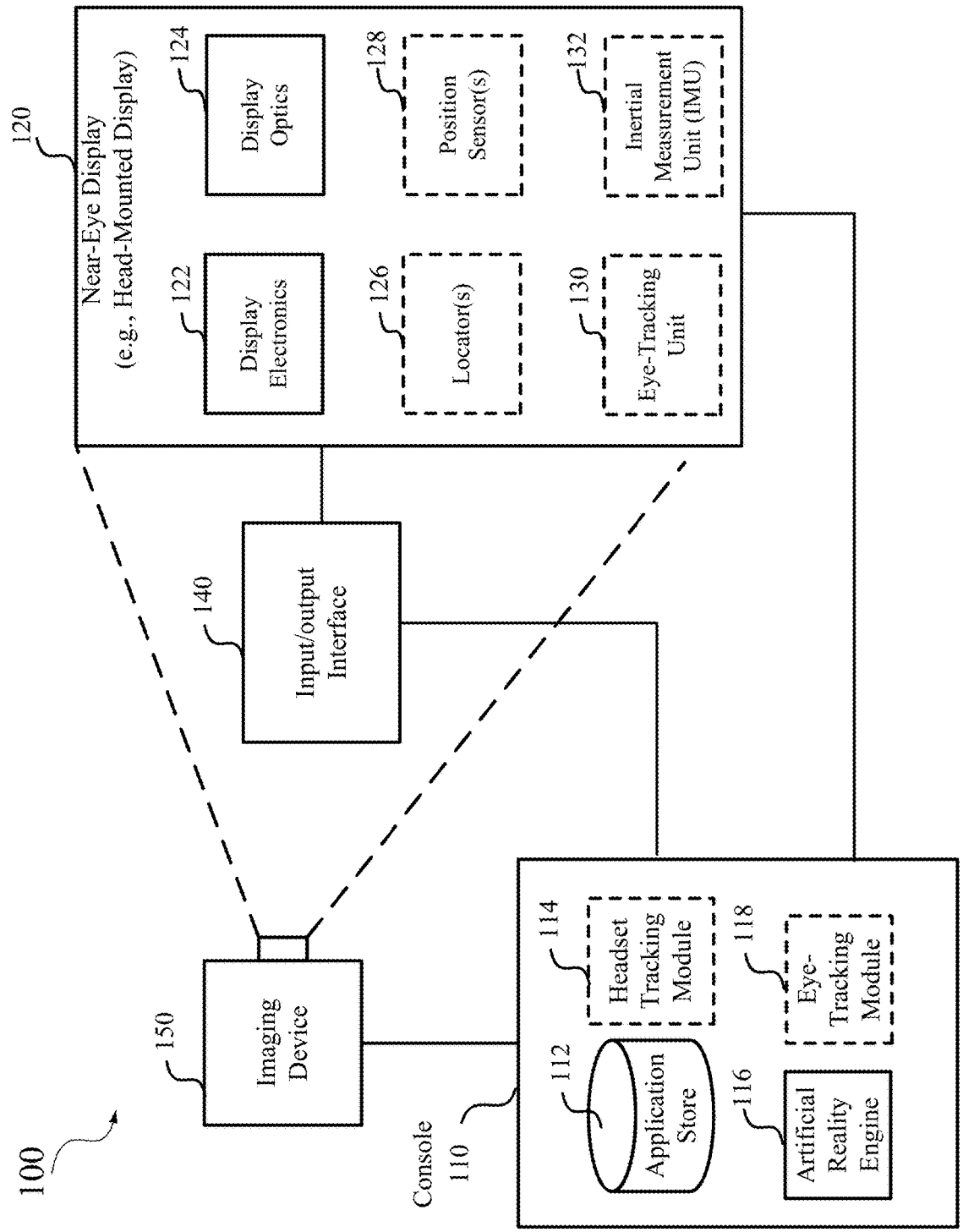
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to semiconductor light emitting devices, such as semiconductor lasers, resonant cavity light emitting diodes (RCLEDs), vertical cavity surface emitting lasers (VCSELs), and vertical external cavity surface emitting lasers (VECSELs). According to certain embodiments, a semiconductor light emitting device may include an active region that emits light in a longer wavelength (e.g., in near-infrared or infrared band), and a planar optical component that focuses the light in the longer wavelength into a second harmonic generation (SHG) crystal, which may then convert the light in the longer wavelength into light having a shorter wavelength (e.g., visible light). The planar optical component may include, for example, a micro-lens formed in semiconductor layers or a gradient refractive index (GRIN) lens formed in the SHG crystal. Various inventive embodiments are described herein, including devices, systems, methods, materials, processes, and the like.

Semiconductor light emitting devices may be used in many optical systems, such as display systems and sensor systems. For example, the light emitting devices may be used in various sensor systems, such as systems for depth sensing, three-dimensional sensing, object tracking (e.g., hand tracking or face tracking), and the like, where light beams emitted by the light emitting devices may be scanned or otherwise directed to desired directions or regions. In some display systems, visible display light emitted from a visible light source (e.g., a diode laser array or a micro-light emitting diode (micro-LED) array) may be coupled into a display (e.g., a waveguide display) for delivering images to a viewer's eyes. The overall efficiency $\eta_{tot}$ of a display system may be determined by $\eta_{tot}=\eta_{EQE}\times\eta_{in}\times\eta_{out}$, where $\eta_{EQE}$ is the external quantum efficiency (EQE) of each light source (e.g., a laser or micro-LED) and may be proportional to a product of the carrier (e.g., electron) injection efficiency, the internal quantum efficiency, and the light extraction efficiency (LEE). $\eta_{in}$ is the in-coupling efficiency of the visible display light from the light source into the waveguide. $\eta_{out}$ is the out-coupling efficiency of the visible display light from the waveguide towards the viewer's eye. To improve, for example, the brightness, resolution, and efficiency of an optical system (e.g., a display system), visible light sources having small sizes, high brightness, high efficiencies, and low power consumption may be desired. However, it is challenging to make such visible light sources.

According to certain embodiments, a visible semiconductor light source may include an active semiconductor region that may emit light in the near infrared (NIR) or infrared (IR) band with a high efficiency. The visible semiconductor light source may also include a nonlinear crystal that may convert the IR light into visible light due to frequency doubling caused by the nonlinear optoelectronic effect of the nonlinear crystal. The nonlinear crystal may include, for example, $LiNbO_3$, KTP, BBO, LBO, KTO, BTO, and the like. To achieve the nonlinear effect of SHG or frequency doubling, the light field in the nonlinear crystal may need to have a high intensity, which may be achieved by, for example, focusing the IR light emitted from the active semiconductor region into the nonlinear crystal, using short laser pulses (e.g., mode-locked or phase-locked laser pulses), and/or placing the nonlinear crystal in the laser cavity.

In certain embodiments, the IR light generated in the active semiconductor region may be focused using a planar optical component (e.g., a planar lens) formed in the laser cavity, between the laser cavity and the nonlinear crystal, or in the nonlinear crystal. The planar lens may also function as a stabilization element in the laser cavity. The focused IR light may have a small cross-sectional area and thus a high light intensity in a small area of the nonlinear crystal to generate visible light with a high power by frequency doubling in the nonlinear crystal. In some embodiments, the planar optical component may be formed in a plurality of epitaxially grown semiconductor layers. The plurality of semiconductor layers may have different compositions and thus can be laterally oxidized or etched at different rates to form regions having different refractive indices in the semiconductor layers, thereby forming a desired optical path length (OPL) or optical thickness profile of a lens. For example, the oxidized regions may have a lower refractive index than the unoxidized semiconductor regions. The different oxidation rates of the different semiconductor layers may cause different areas of the semiconductor layers to be oxidized after a certain oxidation time period, thereby forming a planar device with the OPL profile of a positive lens. The thickness and the composition of each semiconductor layer can be precisely controlled in an epitaxial growth process to more precisely and more reliably fabricate the planar optical components using semiconductor processing techniques, such as photolithography, lateral oxidation, and/or wet etching.

In one embodiment, the laser cavity may include two parallel reflectors (e.g., distributed Bragg reflectors (DBRs)), and a semiconductor light emitting region between the two reflectors. The semiconductor light emitting region may include carrier injection layers and light emitting layers (e.g., quantum wells (QWs) or quantum dots), which may form a light emitting diode that can emit IR light. In some embodiments, the planar optical component may be formed in any location in the laser cavity, such as between the semiconductor light emitting region and a reflector or in the semiconductor light emitting region (e.g., in the light emitting layers or the quantum well barrier layers). In some embodiments, the planar optical component may be formed outside of the laser cavity, such as between a reflector of the laser cavity and the nonlinear crystal. In some embodiments, the planar optical component may include a gradient index (GRIN) lens formed in the nonlinear crystal. The nonlinear crystal may be attached to one of the two reflectors. A wavelength-selective reflection layer may be coated on the nonlinear crystal to reflect the IR light back into the laser cavity and to transmit visible light generated in the nonlinear crystal by the frequency doubling out of the visible semiconductor light source. Thus, the wavelength-selective reflection layer may form an external cavity with a reflector of the two parallel reflectors of the laser cavity.

According to certain embodiments, the planar optical component may be manufactured using precise, reliable, and cost-effective wafer level processing techniques that are compatible with the techniques for fabricating semiconductor devices, such as epitaxial growth and lateral oxidation (or wet etching) techniques. In one example, a plurality of semiconductor layers may be epitaxially grown, in a manner similar to the epitaxial growth of the layers of the semiconductor light emitting region and the DBR layers. The compositions of the plurality of semiconductor layers may vary across the plurality of semiconductor layers, such that the plurality of semiconductor layers may have different lateral oxidation rates or lateral etch rates. In some embodiments, trenches may be formed in certain regions of the plurality of semiconductor layers according to a desired pattern, and the semiconductor layers may then be laterally oxidized or wet etched through the exposed sidewalls in the trenches. The oxidation (or etch) rate can be controlled through the selection of the layer composition. The size of the oxidation (or etch) region can be controlled by the oxidation (or etch) rate and the duration of the exposure of the plurality of semiconductor layers to oxidizing agents (or etchants) at the sidewalls. The different sizes of the oxidized (or etched) regions in different layers may result in an OPL profile of a lens with a certain focal length in the plurality of semiconductor layers due to the different (e.g., lower) refractive index of the oxide compared with the unoxidized semiconductor materials. The plurality of semiconductor layers having different composition may also have different refractive indices, and thus may form a gradient-index optical device.

The light emitting devices described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "μLED" refers to an LED that has a chip where a linear dimension of the chip is less than about 200 μm, such as less than 100 μm, less than 50 μm, less than 20 μm, less than 10 μm, or smaller. For example, the linear dimension of a micro-LED may be as small as 6 μm, 5 μm, 4 μm, 2 μm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
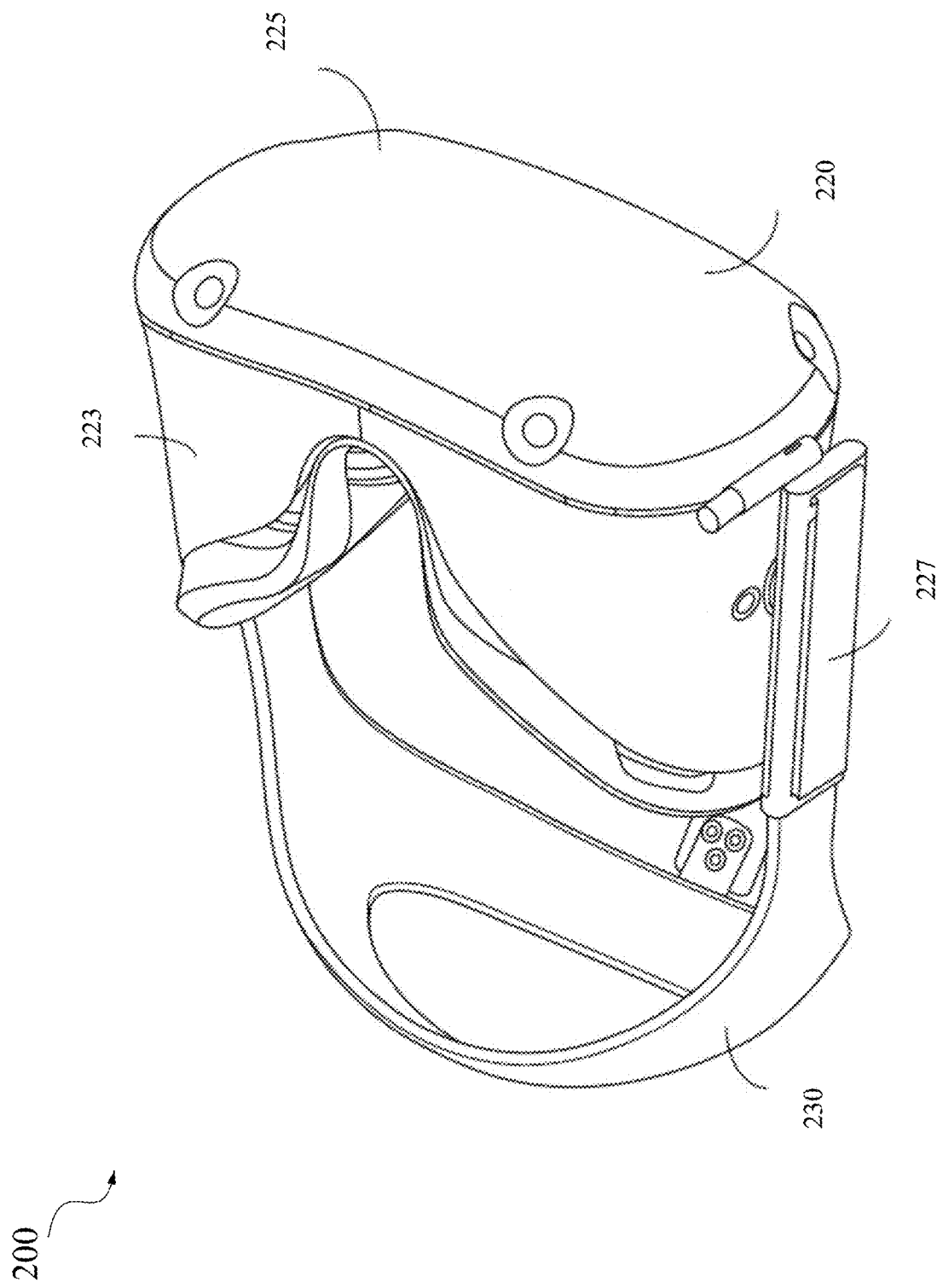
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
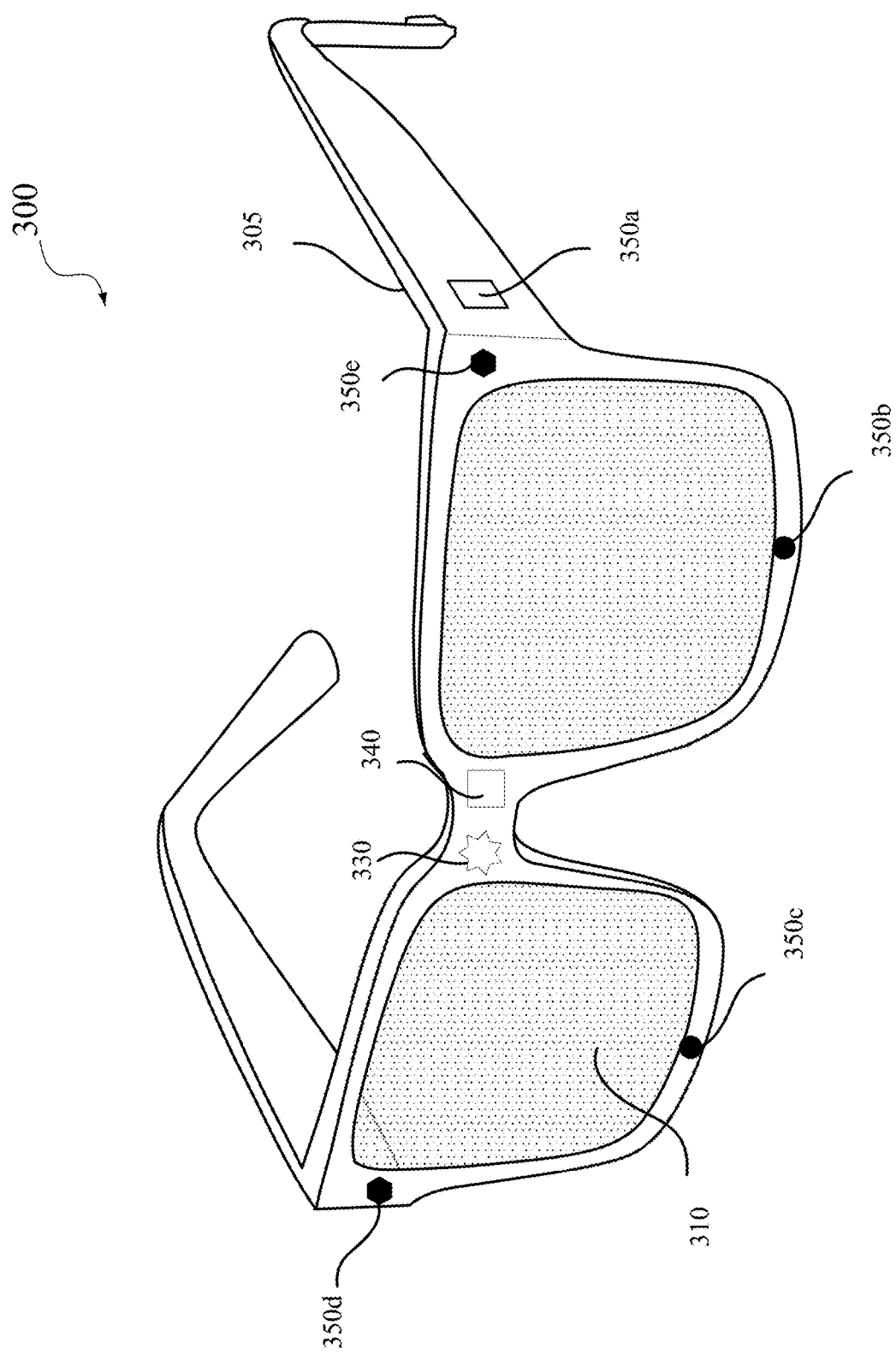
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
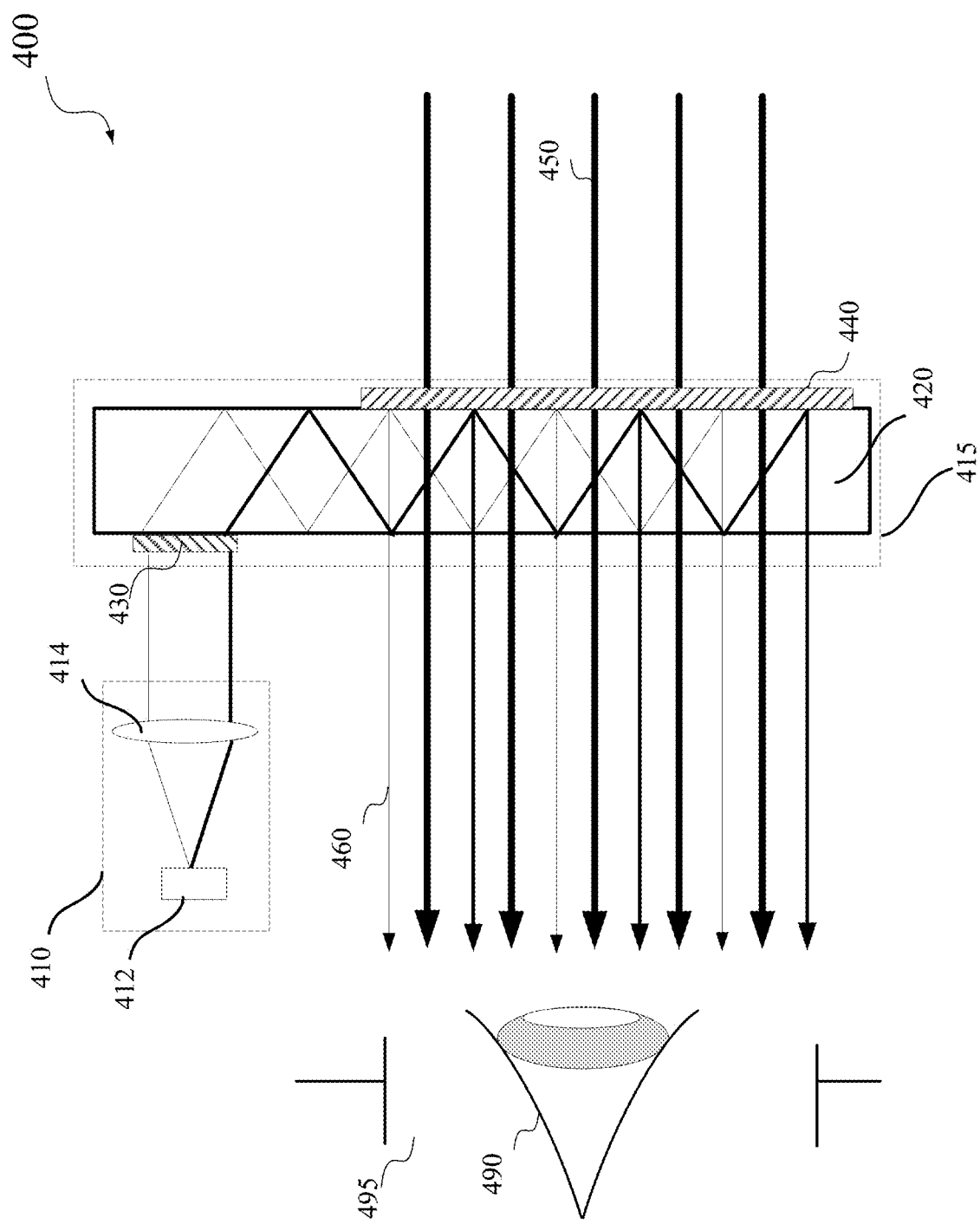
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices or a laser array (e.g., VCSELs). In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements, prisms, and the like. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

Figure 5B:
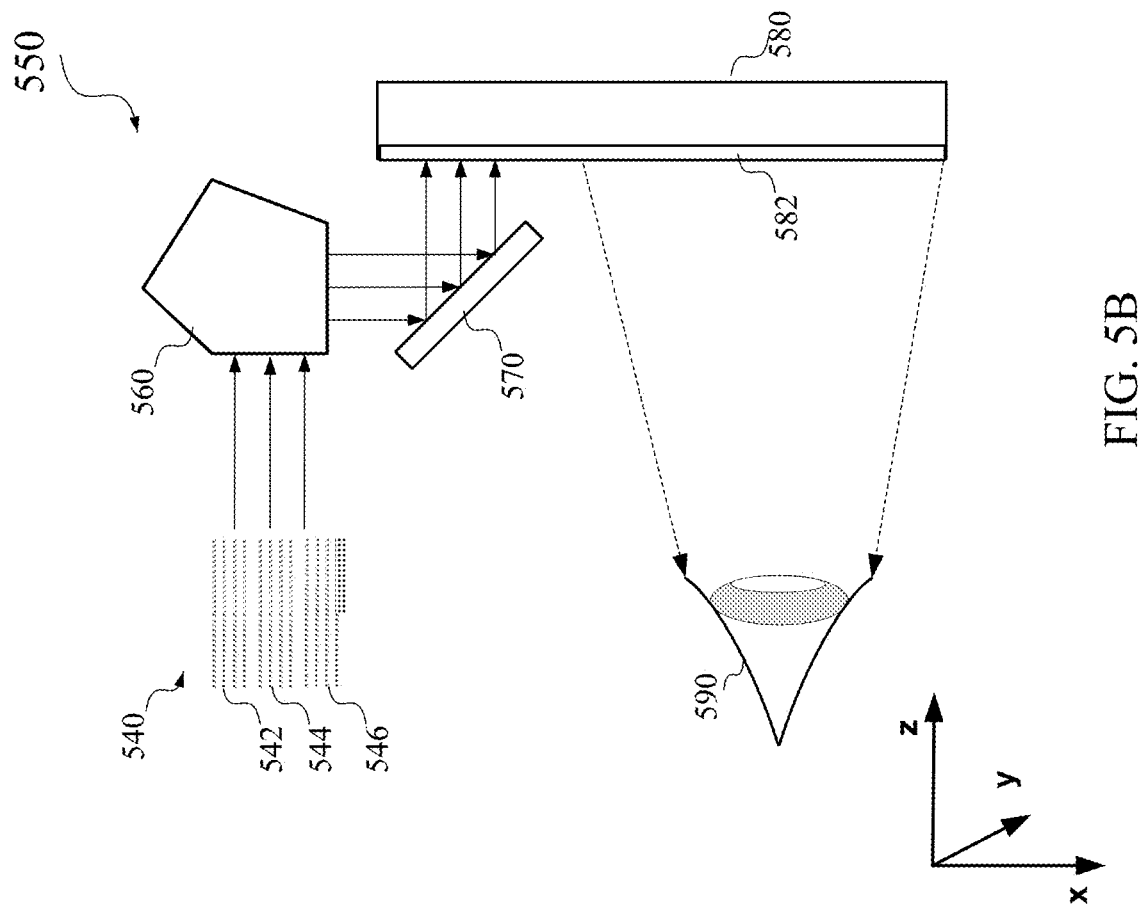
FIG. 5B illustrates an example of a near-eye display device including a waveguide display according to certain embodiments.
Figure 5A:
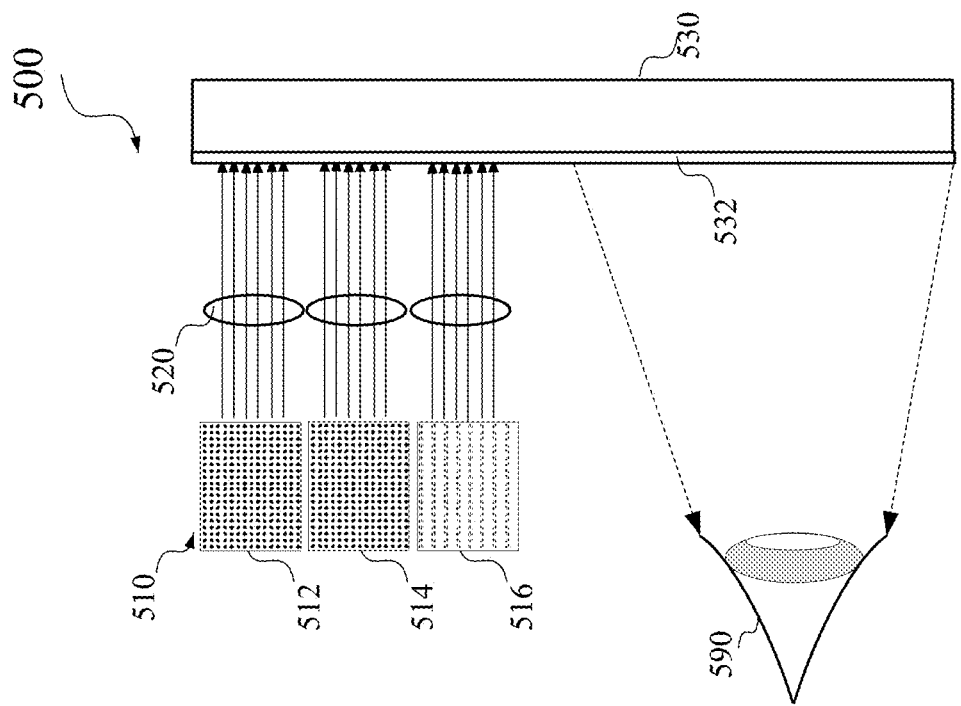
FIG. 5A illustrates an example of a near-eye display device including a waveguide display according to certain embodiments.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The light emitters may include, for example LEDs, VCSELs, organic LEDs (OLEDs, The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920× 1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include enough light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
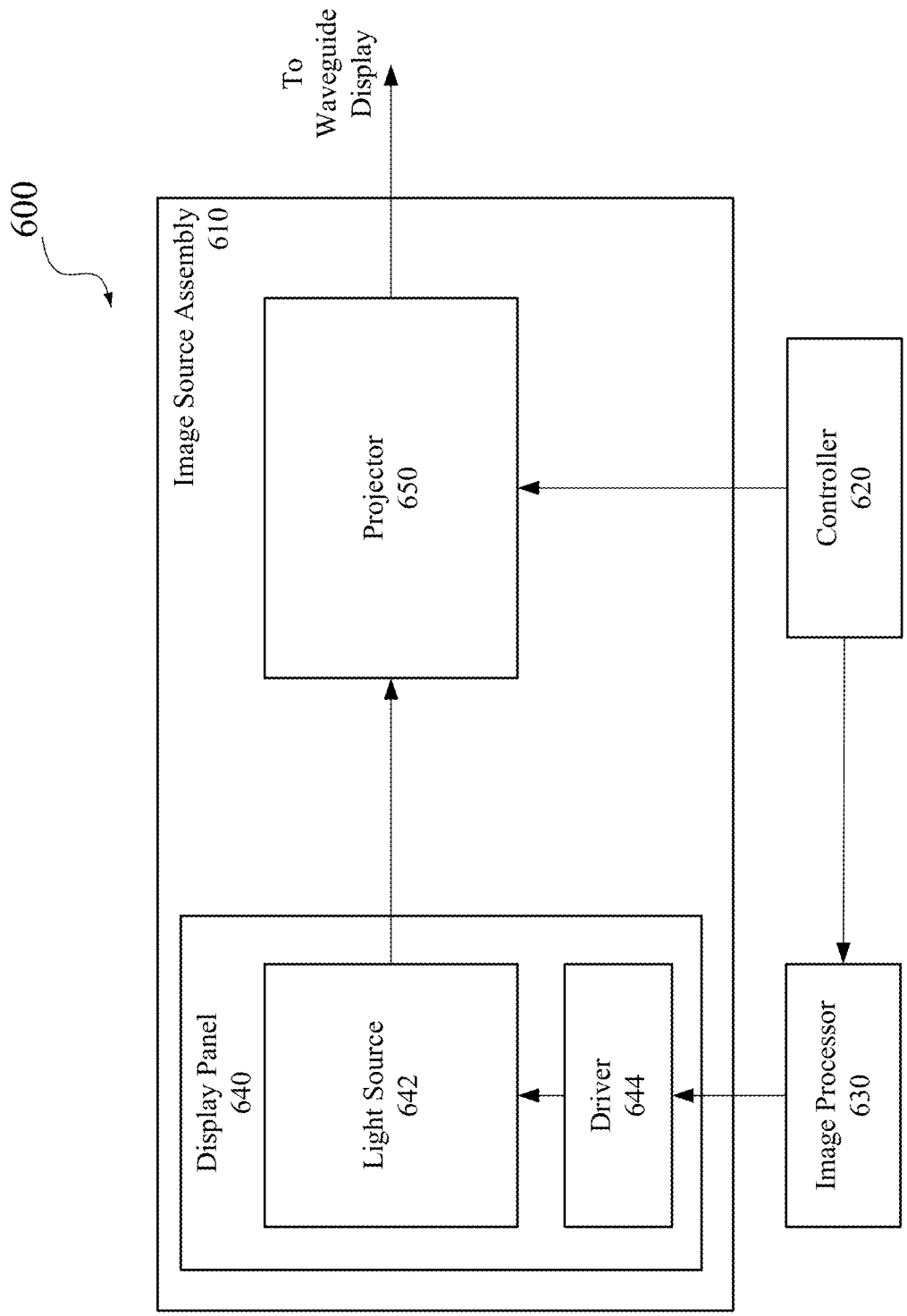
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. For example, each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 7A:
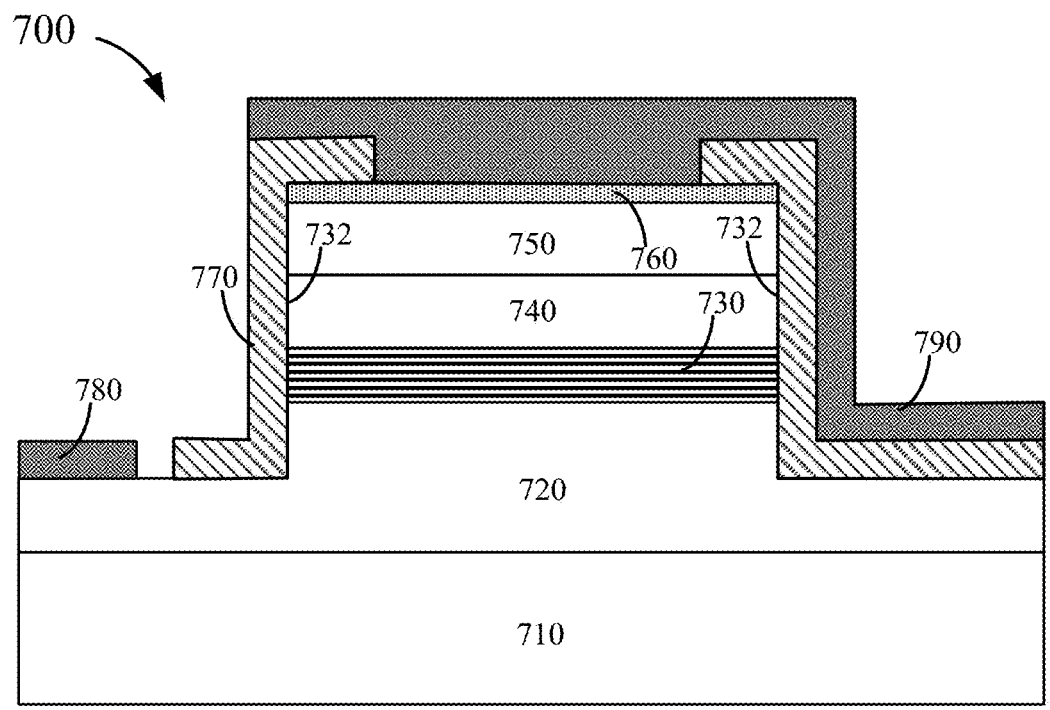
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a P$^+$ or P$^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
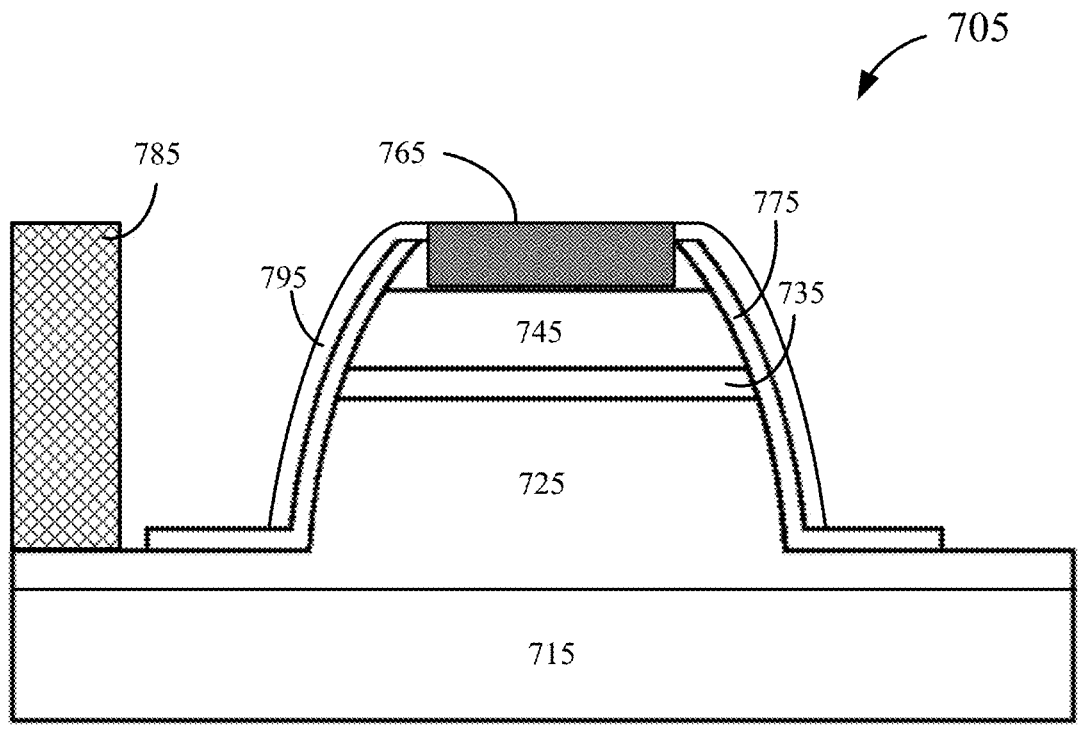
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal to, the growth planes associated with crystalline growth of layers 725-745.

As shown in FIG. 7B, LED 705 may have a mesa structure that includes a flat top. A dielectric layer 775 (e.g., $SiO_2$ or SiNx) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

Figure 8:
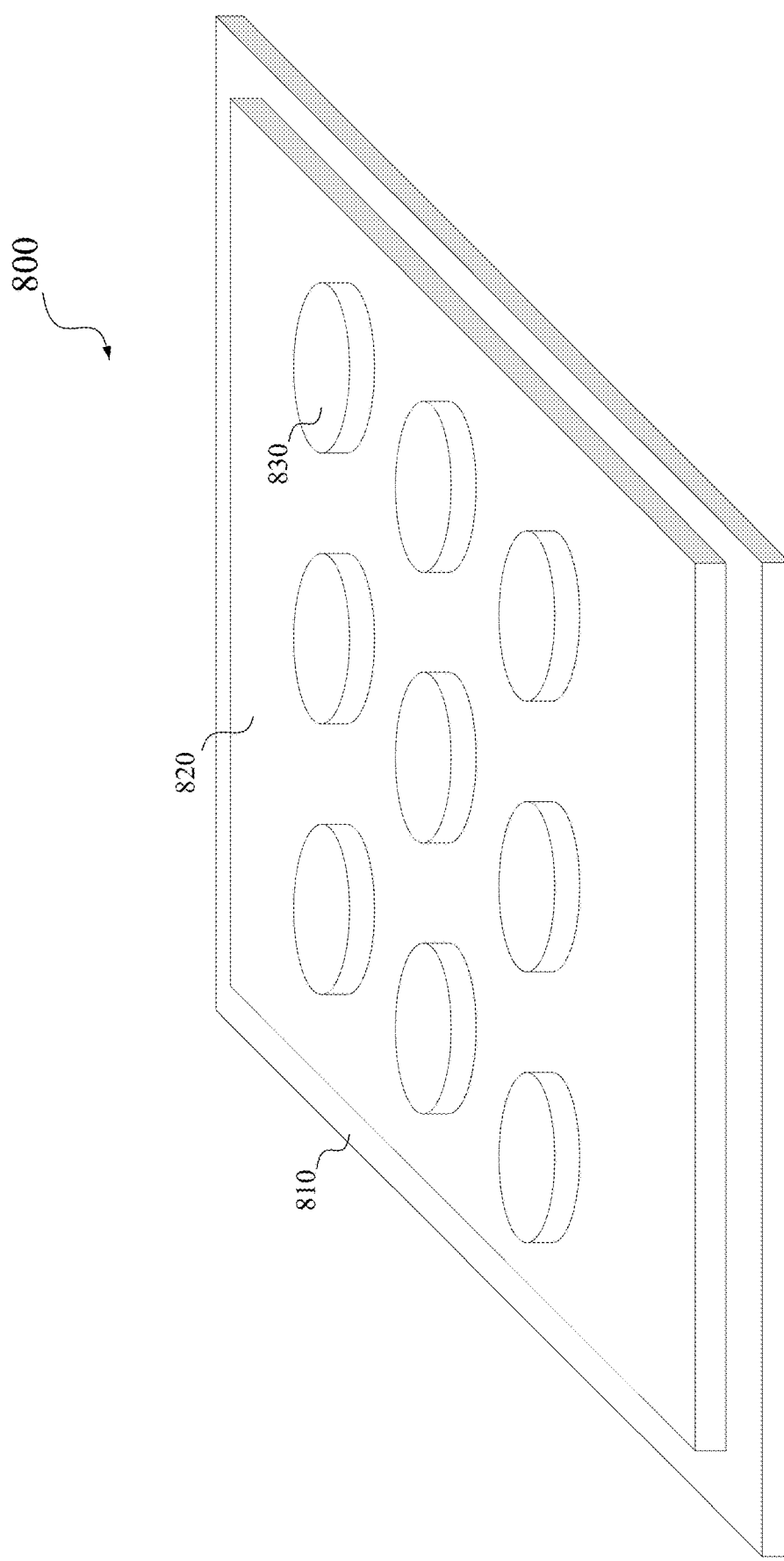
FIG. 8 illustrates an example of an array of lasers.

FIG. 8 illustrates an example of an array of lasers 800, such as VCSELs, that may be used in a display system. The array of lasers 800 may be fabricated on a same die that includes a substrate 820 mounted on a mount 810 (e.g., a print circuit board). The array of lasers 800 may include a two-dimensional array of VCSELs 830. The pith of the array of lasers 800 may be, for example, about 10 μm to about 100 μm. The size of the die may be about 1 mm² or larger. Thus, the array of lasers 800 may include thousands of lasers on the die and may have an output power greater than 1 watt.

VCSELs 830 may generally include a light emitting active region in a laser cavity that forms a laser resonator. The light emitting active region may include QWs that emit photons when properly biased. The photons may be confined in the laser cavity by a pair of mirrors, such as DBR mirrors. VCSELs 830 may be based on a variety of materials. For example, VCSELs with wavelengths from about 650 nm to about 1300 nm may be based on gallium arsenide (GaAs) wafers with DBRs formed by interleaved GaAs and aluminum gallium arsenide (AlGaAs) layers. In GaAs—AlGaAs VCSELs, the lattice constants of the materials do not vary significantly as the composition is changed, thus permitting multiple lattice-matched epitaxial layers to be grown on a GaAs substrate. AlGaAs-based DBRs can have a reflectivity close to 100%, which can efficiently confine photons in the laser cavity. The refractive index of AlGaAs can vary as the Al fraction is increased, thus minimizing the number of layers used to form DBR with a high reflectivity. AlGaAs-based DBRs doped with p- or n-type impurities can also serve as current paths. Selectively oxidizing the AlGaAs layers adjacent to the QWs can also provide lateral confinement of both photons and carriers.

Figure 9:
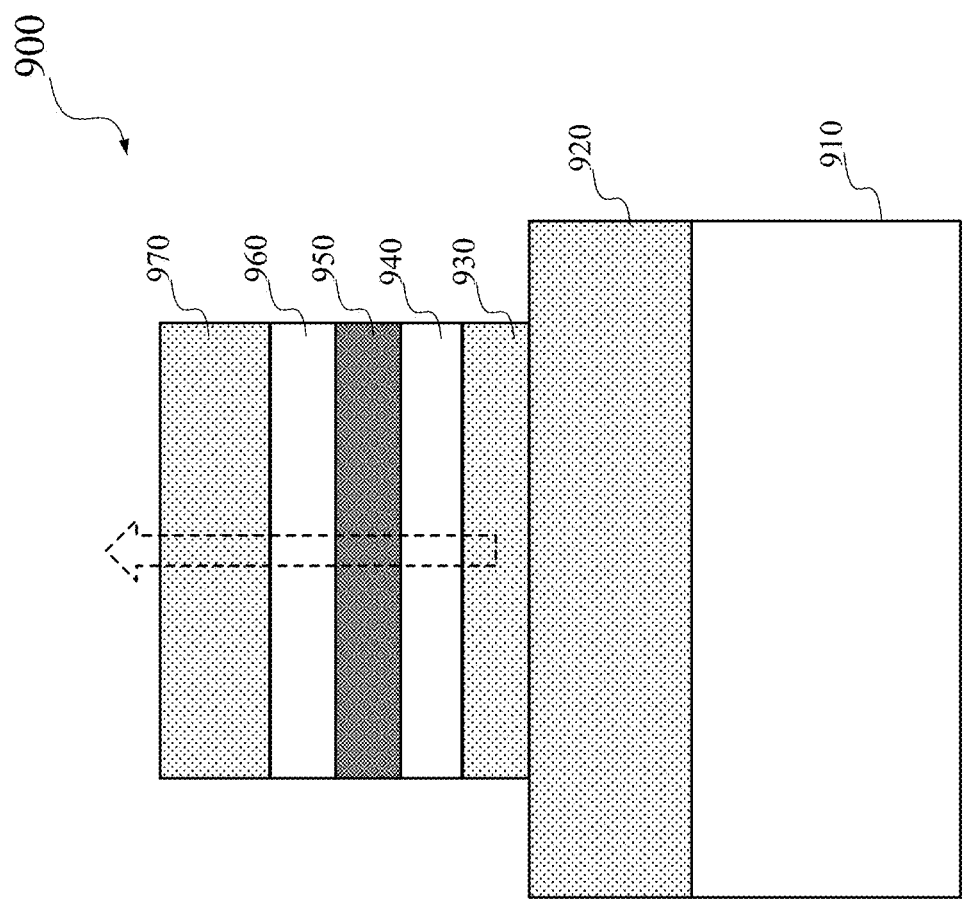
FIG. 9 illustrates an example of a vertical cavity surface emitting laser (VCSEL).

FIG. 9 illustrates an example of a VCSEL 900, such as a VCSEL 830. VCSEL 900 may include a substrate 910, such as a GaAs substrate or a GaN substrate. A bulk DBR 920 may be formed (e.g., epitaxially grown) on substrate 910. Bulk DBR 920 may include multiple interleaved layers of different materials that have different refractive indices, such as multiple pairs of AlGaAs/GaAs or AlAs/GaAs layers, and thus may reflect light at the interfaces between the different material layers to achieve a high overall reflectivity. A bottom DBR 930 may be formed on bulk DBR 920 or may be part of bulk DBR 920. Bottom DBR 930 may similarly include multiple interleaved layers of different materials with different refractive indices. VCSEL 900 may also include a cladding layer 940, an active region 950, and a cladding layer 960, where cladding layers 940 and 960 may be p-doped or n-doped and may inject carriers into active region 950. Active region 950 may include one or more quantum wells or quantum dots, and QW barrier layers. Carriers may recombine in active region 950 to emit photons. A top DBR 970 may be formed on cladding layer 960, and may be similar to bottom DBR 930. Top DBR 970 and bottom DBR 930 (and bulk DBR 920) may form a plane-parallel laser cavity that can confine photons. Top DBR 970, cladding layer 960, active region 950, cladding layer 940, and bottom DBR 930 may be vertically etched to form individual VCSELs of a desired size with a desired pitch on bulk DBR 920 and substrate 910, as shown in FIG. 8.

VCSEL 900 may have dimensions less than about 100 μm×100 μm. In some embodiments, the parallel laser cavity may have a length of, for example, about 10 μm. In the example shown in FIG. 9, bottom DBR 930 and bulk DBR 920, in combination, may have a reflectivity close to 100% to reflect all incident photons. Top DBR 970 may have a reflectivity less than 100%, such that a portion of the emitted photons may be transmitted out of the laser cavity through top DBR 970. VCSEL 900 may emit, for example, infrared light with a high efficiency and a high power, such as about 1 mW to about 10 mW.

In a laser system, a laser cavity formed by two opposing mirrors is generally used to reflect light in the laser cavity to form standing waves for certain resonance frequencies (or longitudinal modes) in a gain medium. Light confined in the laser cavity may be reflected many times by the mirrors. Optical waves with certain field patterns and frequencies may be sustained by the laser cavity due to the constructive interference of the optical waves after each round trip within the laser cavity, while other optical waves may be suppressed due to destructive interference. The geometry of the laser cavity, such as the length of the cavity and the shapes and the sizes of the mirrors, may be chosen such that the laser beam of the desired frequency may remain stable in the laser cavity, where the size of the light beam in the laser cavity does not continuously grow and eventually get lost after multiple reflections when the size of the light beam at a mirror is greater than the size of the mirror.

Figure 10A:
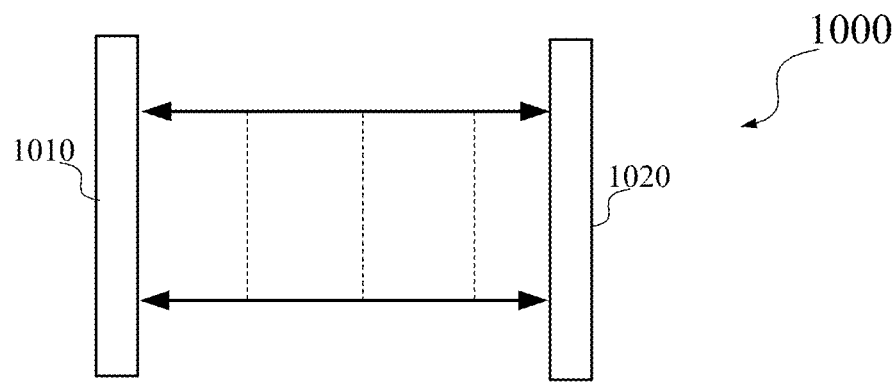
FIG. 10A illustrates an example of a parallel laser cavity.

FIG. 10A illustrates an example of a parallel laser cavity 1000. Parallel laser cavity 1000 may be used in short cavity lasers, such as VCSELs. Parallel laser cavity 1000 may be formed by a pair of flat mirrors 1010 and 1020, such as DBR mirrors. The optical wave may propagate as a plane wave in parallel laser cavity 1000, where the wavefront may be parallel to flat mirrors 1010 and 1020.

Figure 10B:
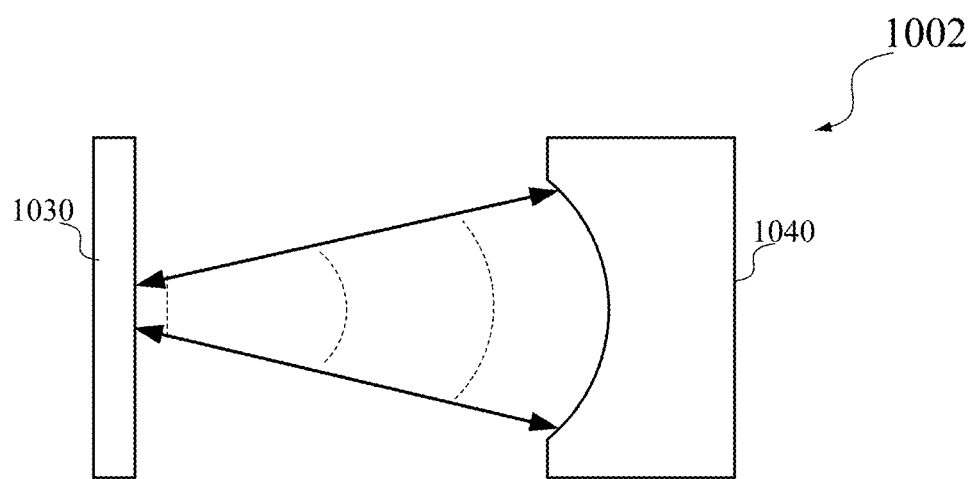
FIG. 10B illustrates an example of a hemispherical laser cavity formed by a curved mirror and a flat mirror.

FIG. 10B illustrates an example of a hemispherical laser cavity 1002 formed by a curved mirror 1040 and a flat mirror 1030. The optical wave in hemispherical laser cavity 1002 may have a waist (with a minimum beam diameter) at flat mirror 1030, where the wavefront of the optical wave may be a plane wave. Curved mirror 1040 may have a concave spherical shape that matches the wave front of the optical wave at curved mirror 1040 to form a stable cavity. Hemispherical laser cavity 1002 may generally be a free space cavity with a length about a few centimeters.

Figure 10C:
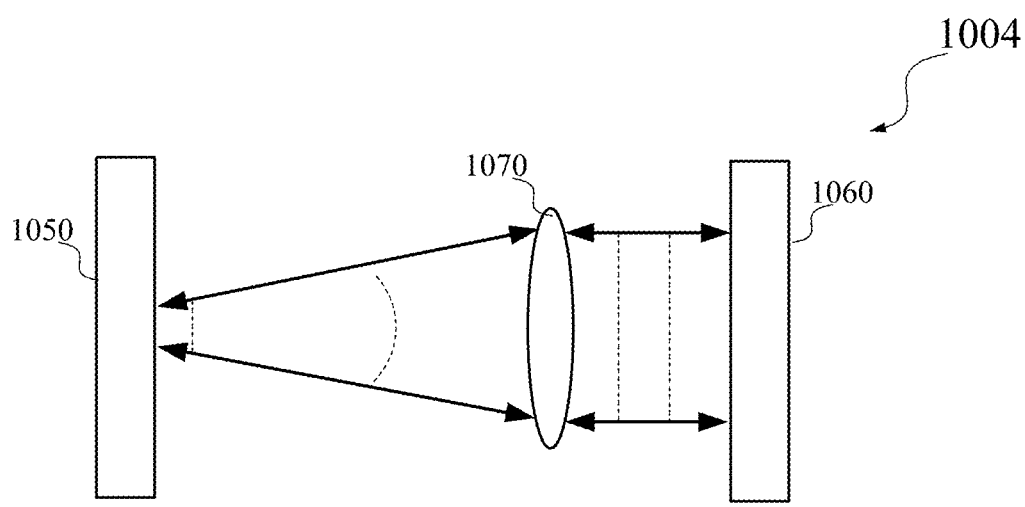
FIG. 10C illustrates an example of a hemispherical cavity formed by two flat mirrors and a lens.

FIG. 10C illustrates an example of a hemispherical laser cavity 1004 formed by two flat mirrors 1050 and 1060 and a lens 1070. The optical wave in hemispherical laser cavity 1004 may have a waist (with a minimum beam diameter) at flat mirror 1050, where the wavefront of the optical wave may be a plane wave. Lens 1070 may collimate the light beam from flat mirror 1050 to form a plane wave that propagates towards flat mirror 1060 to form a stable cavity. Hemispherical laser cavity 1004 may generally be a free space cavity with a length about a few centimeters or longer.

VCSELs that emit light in the red or infrared spectrum, such as GaAs—AlGaAs VCSELs, may achieve a high efficiency and a high power. However, it is difficult to make visible light semiconductor lasers (e.g., VCSELs) that have small sizes (and thus high resolution) and high efficiencies (and thus high brightness and low power) for displays or other applications. According to certain embodiments, a semiconductor light source may include an active region that emits light in a longer wavelength (e.g., in NIR or IR band) with a high efficiency, an SHG crystal, and an optical component (e.g., a micro-lens) that focuses the light with the longer wavelength into the SHG crystal, which may convert the light in the longer wavelength into light with a shorter wavelength (e.g., visible light). The active region may be a gain medium within a laser cavity.

Figure 11:
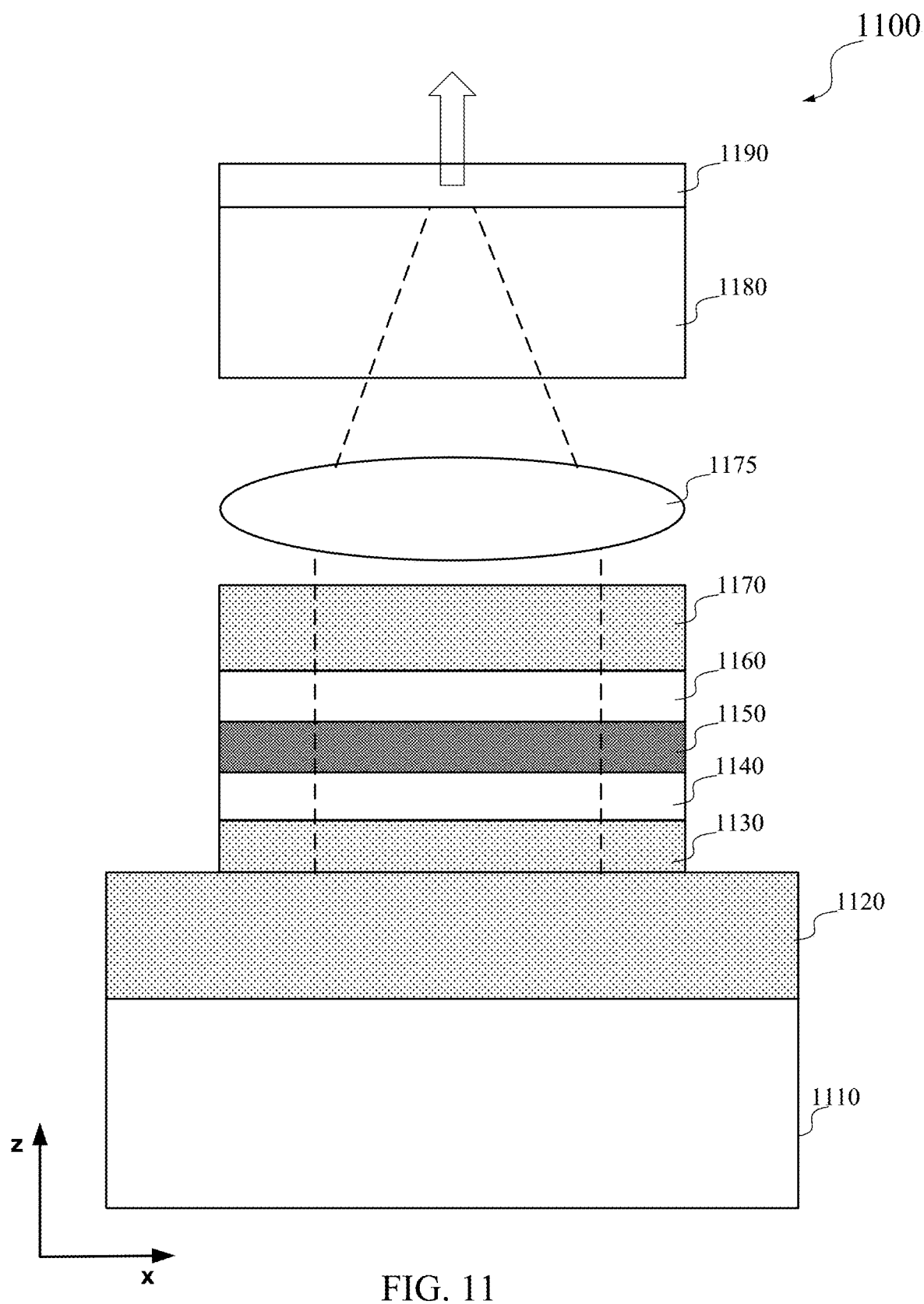
FIG. 11 illustrates an example of a light source including a lens and a second harmonic generation crystal according to certain embodiments.

FIG. 11 illustrates an example of a light source 1100 including a lens 1175 and a second harmonic generation crystal 1180 according to certain embodiments. Light source 1100 may include a substrate 1110, such as a GaAs substrate or a GaN substrate. A bulk DBR 1120 may be formed (e.g., epitaxially grown) on substrate 1110. Bulk DBR 1120 may include multiple interleaved layers of different materials that have different refractive indices, such as multiple pairs of AlGaAs/GaAs or AlAs/GaAs layers, and thus may reflect light at the interfaces between the different material layers to achieve a high overall reflectivity. A bottom DBR 1130 may be formed on bulk DBR 1120 or may be part of bulk DBR 1120. Bottom DBR 1130 may similarly include multiple interleaved layers of different materials with different refractive indices. Light source 1100 may also include a cladding layer 1140, an active region 1150, and a cladding layer 1160, where cladding layers 1140 and 1160 may be p-doped or n-doped and may inject carriers into active region 1150. Active region 1150 may include one or more quantum wells or quantum dots, and QW barrier layers. Carriers may recombine in active region 1150 to emit photons of infrared light. A top DBR 1170 may be formed on cladding layer 1160, and may be similar to bottom DBR 1130. Top DBR 1170 and bottom DBR 1130 (and bulk DBR 1120) may form a plane-parallel laser cavity that can confine photons. Bottom DBR 1130 and bulk DBR 1120, in combination, may have a reflectivity close to 100% to reflect all incident photons. Top DBR 1170 may have a reflectivity less than 100%, such that a portion of the emitted photons may be transmitted out of the laser cavity through top DBR 1170. Top DBR 1170, cladding layer 1160, active region 1150, cladding layer 1140, and bottom DBR 1130 may be etched to form individual VCSELs on bulk DBR 1120 and substrate 1110, as shown in FIG. 8.

Light transmitted through top DBR 1170 may be focused by lens 1175 into SHG crystal 1180, where two photons with the same frequency may interact with SHG crystal 1180 to generate a new photon with twice the energy (and thus twice the frequency or half the wavelength) of the initial photons. The intensity of the light in the shorter wavelength (e.g., visible light) may depend on the intensity of the light in the longer wavelength (e.g., IR light) and the nonlinear coefficient (e.g., $\chi^{(2)}$) of SHG crystal 1180. The intensity of the light in the longer wavelength in certain regions of SHG crystal 1180 may need to be high enough to generate the light in the shorter wavelength with a certain intensity. SHG crystal 1180 may include various crystals without inversion symmetry, such as, for example, $LiNbO_3$, $KNbO_3$, KTP ($KTiOPO_4$), BBO ($\beta$-$BaB_2O_4$), KDP ($KH_2PO_4$), LBO, KTO, BTO, and the like.

A wavelength-selective reflection layer 1190 may be formed (e.g., coated or deposited) on SHG crystal 1180. Wavelength-selective reflection layer 1190 may have a high reflectivity for IR light and a low reflectivity for visible light, such that IR light may be reflected and visible light may be transmitted by wavelength-selective reflection layer 1190. For example, wavelength-selective reflection layer 1190 may include an optical filter that can reflect IR light and allow visible light to pass through. Thus, wavelength-selective reflection layer 1190 may also be an anti-reflection layer for visible light. In some embodiments, at least a portion of the IR light reflected by wavelength-selective reflection layer 1190 may be recycled and reenter the laser cavity. Thus, wavelength-selective reflection layer 1190 may be used to form an external cavity with top DBR 1170.

In the example shown in FIG. 11, the external cavity may include a free-space cavity with a length of a few centimeters or longer. Lens 1175 may include a discrete lens in the free-space cavity. Thus, the size of light source 1100 may be large and it may be difficult and costly to fabricate an array of light sources 1100.

In some embodiments, the high intensity of the IR light in the nonlinear crystal may be achieved using short laser pulses (e.g., mode-locked or phase-locked laser pulses), and/or by placing the nonlinear crystal in the optical cavity of the laser. For example, the modes supported by the laser cavity may be made to have fixed phase relations such that they may periodically constructively interfere with each other to produce a strong burst or pulse of light, where the pulses may have a nanosecond, sub-nanosecond, picosecond, or femtosecond duration. Due to the short duration of the light pulses, the instantaneous power of the light pulses may be very high.

According to some embodiments, a planar optical component, such as a planar lens, may be used to focus the IR light into the nonlinear crystal in a compact, monolithic visible light source. The planar optical component may be inside or outside of the laser cavity. The planar optical component can be manufactured using semiconductor processing techniques, such as epitaxial growth and lateral oxidation or wet etching. Therefore, the planar optical component may be more precisely, reliably, and efficiently manufactured in a same process that is used to fabricate the IR light source. In addition, no free-space cavity or discrete component may be used, and thus no additional alignment and assembly steps may be needed to couple the IR light source, the focusing lens, and the nonlinear crystal.

Figure 12:
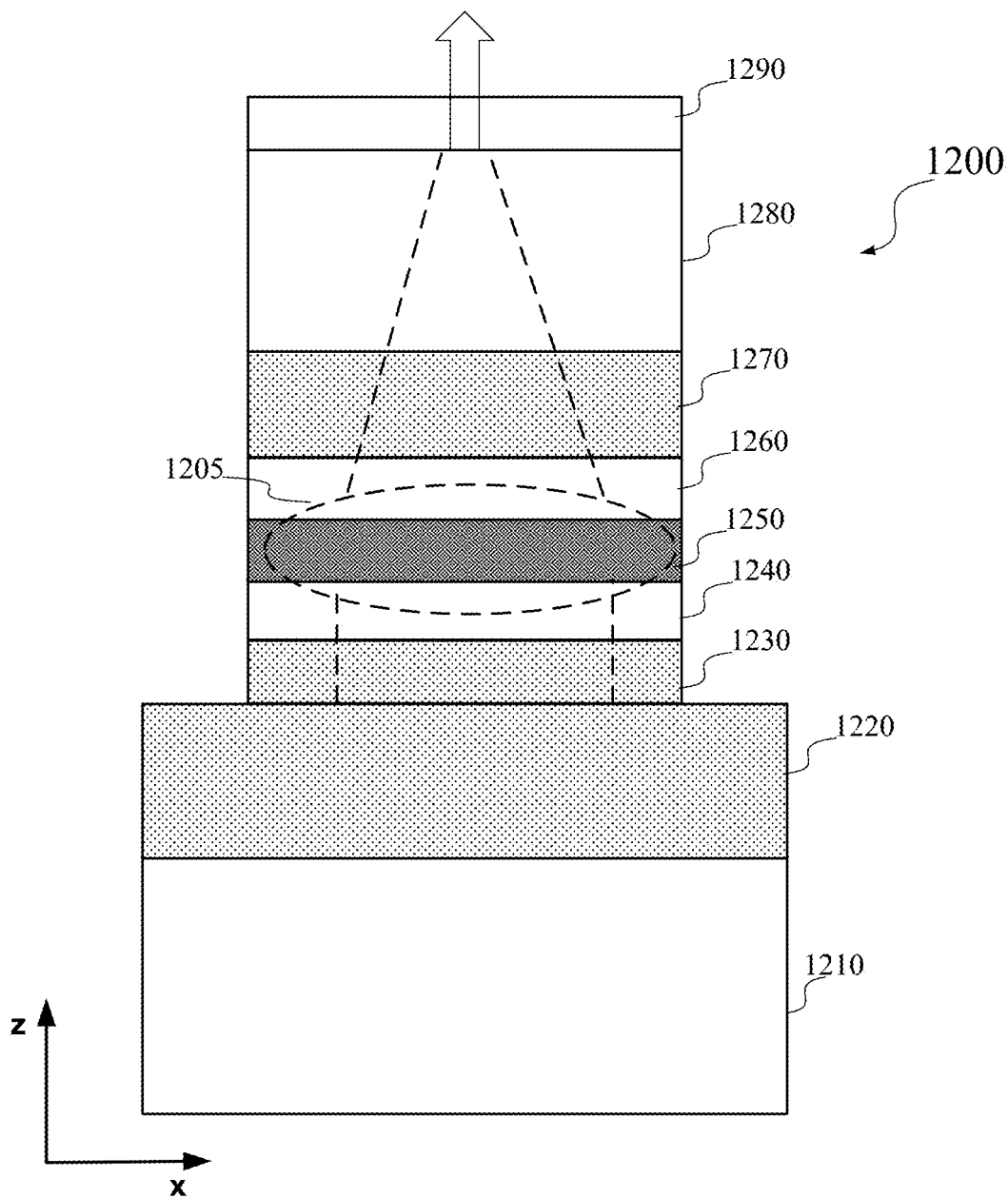
FIG. 12 illustrates an example of a light source including a planar lens and a nonlinear crystal according to certain embodiments.

FIG. 12 illustrates an example of a light source 1200 including a planar lens 1205 and a nonlinear crystal 1280 according to certain embodiments. Light source 1200 may be a VCSEL, RCLED, VECSEL, or the like. Light source 1200 may include a substrate 1210, such as a GaAs substrate or a GaN substrate. A bulk DBR 1220 may be formed (e.g., epitaxially grown) on substrate 1210. Bulk DBR 1220 may include multiple interleaved layers of different materials that have different refractive indices, such as multiple pairs of AlGaAs/GaAs or AlAs/GaAs layers, and thus may reflect light at the interfaces between the different material layers to achieve a high overall reflectivity. A bottom DBR 1230 may be formed on bulk DBR 1220 or may be part of bulk DBR 1220. Bottom DBR 1230 may similarly include multiple interleaved layers of different materials with different refractive indices.

Light source 1200 may also include a cladding layer 1240, an active region 1250, and a cladding layer 1260, where cladding layers 1240 and 1260 may be p-doped or n-doped and may inject carriers into active region 1250. Active region 1250 may include one or more quantum wells or quantum dots, and QW barrier layers. Carriers may recombine in active region 1250 to emit photons of infrared light.

A top DBR 1270 may be formed on cladding layer 1260, and may be similar to bottom DBR 1230. Top DBR 1270 and bottom DBR 1230 (and bulk DBR 1220) may form a plane-parallel laser cavity that can confine photons. Bottom DBR 1230 and bulk DBR 1220 may have an overall reflectivity close to 100% to reflect all incident photons. Top DBR 1270 may have a reflectivity less than 100%, such that a portion of the emitted photons may be transmitted out of the plane-parallel laser cavity through top DBR 1270. Top DBR 1270, cladding layer 1260, active region 1250, cladding layer 1240, and bottom DBR 1230 may be vertically etched to form individual light sources on bulk DBR 1220 and substrate 1210.

Nonlinear crystal 1280 may be attached to top DBR 1270. Nonlinear crystal 1280 may include a plate of a crystal without inversion symmetry, such as $LiNbO_3$, $KNbO_3$, KTP, BBO, KDP, LBO, KTO, BTO, and the like. A wavelength-selective reflection layer 1290 that reflects IR light and transmits visible light may be formed (e.g., coated or deposited) on nonlinear crystal 1280.

In the example illustrated in FIG. 12, a planar lens 1205 may be formed anywhere in the laser cavity between top DBR 1270 and bottom DBR 1230. For example, a plurality of layers including a semiconductor material having the chemical composition $Al_xGa_{1-x}As$ may be epitaxially grown between top DBR 1270 and bottom DBR 1230, where x is the molar fraction of aluminum relative to gallium in each layer. In some embodiments, the layers of $Al_xGa_{1-x}As$ may be interleaved with a plurality of layers of, for example, GaAs. The layers of $Al_xGa_{1-x}As$ may be, for example, between bottom DBR 1230 and cladding layer 1240, between cladding layer 1260 and top DBR 1270, or within cladding layer 1260, active region 1250, and cladding layer 1240. The layers of $Al_xGa_{1-x}As$ with different molar fractions of aluminum may have different refractive indices. The layers of $Al_xGa_{1-x}As$ with different molar fractions of aluminum may also have different lateral oxidation rates. Therefore, when laterally oxidized for a certain time period from the sidewalls of the individual light sources formed by the vertical etching, the layers of $Al_xGa_{1-x}As$ with different molar fractions of aluminum may be laterally oxidized for different lengths from the sidewalls. The oxidized regions may have a lower refractive index than the unoxidized regions in the $Al_xGa_{1-x}As$ layers. As such, the effective refractive indices in different horizontal regions of the light source may be different, thereby forming a planar optical component, such as a planar lens.

In some embodiments, top DBR 1270 may not be used. The resonant cavity for IR light may be formed by bottom DBR 1230 and wavelength-selective reflection layer 1290. Thus, nonlinear crystal 1280 may be in the resonant cavity, and planar lens 1205 may focus or collimate the IR light that propagates back and forth in the resonant cavity such that the beam waist of the IR light may be near or at the interface between wavelength-selective reflection layer 1290 and nonlinear crystal 1280, where visible light may be generated due to the nonlinear effect of nonlinear crystal 1280 and the high IR light intensity at the beam waist.

Figures 13A, 13B:
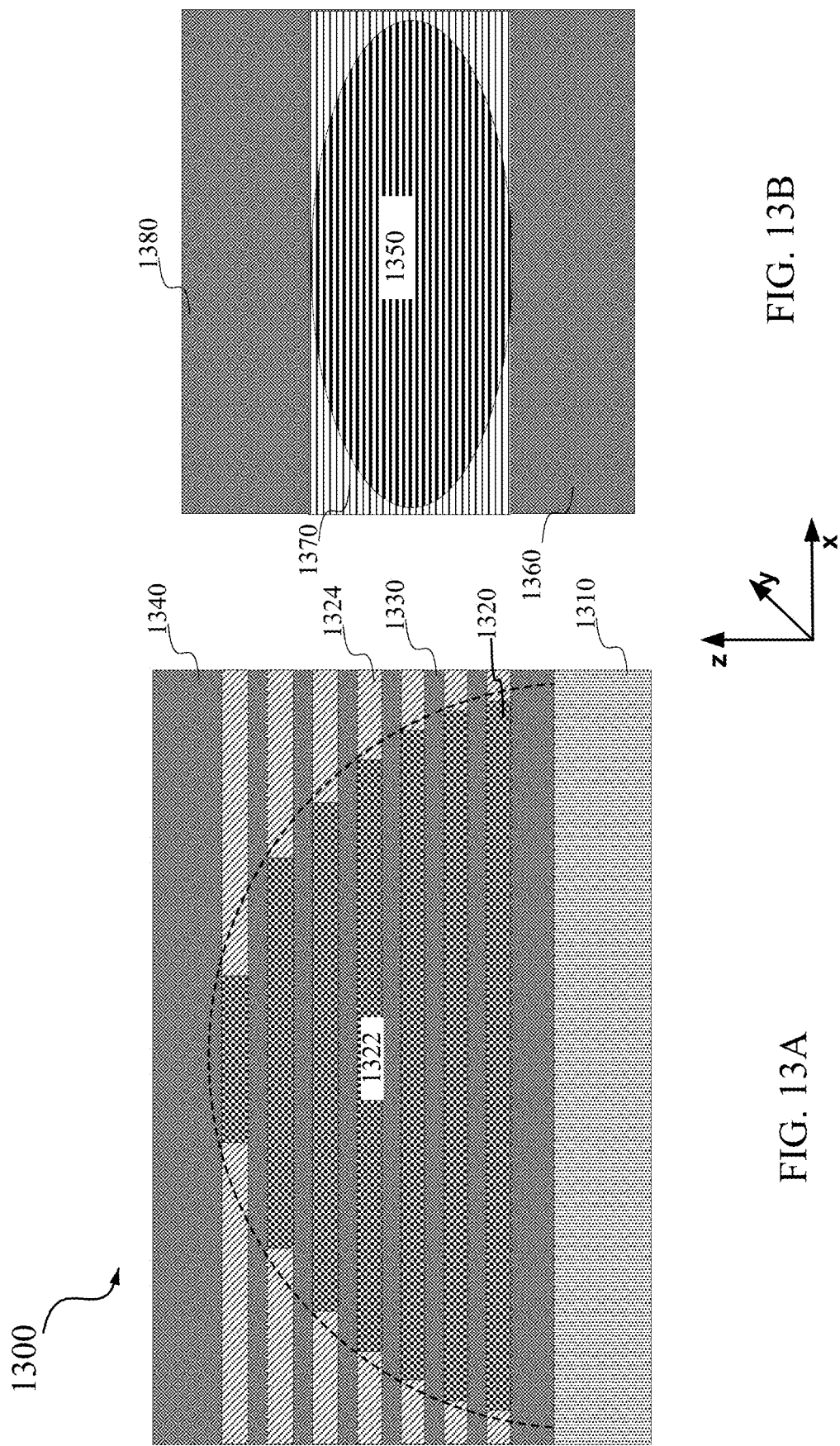
FIG. 13A illustrates an example of a planar lens formed in multiple semiconductor layers according to certain embodiments.
FIG. 13B illustrates an example of a planar lens formed in multiple semiconductor layers according to certain embodiments.

FIG. 13A illustrates an example of a planar lens 1300 formed in multiple semiconductor layers according to certain embodiments. Planar lens 1300 may include one or more semiconductor layers 1320 grown alternately with a plurality of semiconductor layers 1330 on a layer 1310. Layer 1310 may include, for example, a DBR layer (e.g., in bottom DBR 1230 or top DBR 1270), a cladding layer (e.g., cladding layer 1240 or 1260), or an active layer (e.g., in active region 1250). Semiconductor layers 1320 and semiconductor layers 1330 may be formed by epitaxial growth techniques, such as Molecular-beam epitaxy (MBE), Chemical Vapor Deposition (CVD), Metal-Organic Chemical Vapor Deposition (MOCVD), or Liquid Phase Epitaxy (LPE). A layer 1340 may be formed on semiconductor layers 1320 and semiconductor layers 1330. Layer 1340 may include, for example, a cladding layer (e.g., cladding layer 1240), a DBR layer (e.g., in top DBR 1270), or a nonlinear crystal (e.g., nonlinear crystal 1280).

In some embodiments, semiconductor layers 1320 and semiconductor layers 1330 may be transparent or at least partially transparent to IR light, and may each be characterized by a respective refractive index. Semiconductor layers 1320 and semiconductor layers 1330 may have similar refractive indices or different refractive indices. In some embodiments, the thicknesses and the refractive indices of semiconductor layers 1320 and semiconductor layers 1330 may be selected such that semiconductor layers 1320 and semiconductor layers 1330 may form an antireflection structure for IR light. In some embodiments, the thickness of each semiconductor layer 1320 may be the same or different across the one or more semiconductor layers 1320.

In one example, each semiconductor layer 1320 may include a material having the chemical composition $Al_xGa_{1-x}As$, where x is the molar fraction of aluminum relative to gallium in each semiconductor layer 1320. $Al_xGa_{1-x}As$ may have a refractive index about 3 for near-infrared light at about 1000 nm. The composition of each semiconductor layer 1320 may be different, for example, with x between about 0.7 and about 1.0 (e.g., $Al_{0.8}Ga_{0.2}As$), such that each semiconductor layer 1320 may be susceptible to a different respective oxidation rate. The composition of each semiconductor layer 1320 may be achieved through the epitaxial growth process and/or may be achieved by additional doping processes.

In some embodiments, each semiconductor layer 1330 may be characterized by a chemical composition $Al_xGa_{1-x}As$, where x is between about 0.0 and about 0.7 (e.g., GaAs or $Al_{0.2}Ga_{0.8}As$), such that semiconductor layers 1330 may have much lower oxidation rates compared with semiconductor layers 1320.

In some embodiments, semiconductor layers 1320 may be laterally oxidized from the exposed sidewalls of individual light sources towards unexposed regions of semiconductor layers 1320 for a certain oxidation duration, such that at least some semiconductor layers 1320 may be partially oxidized to form oxide regions 1324 that may have a refractive index (e.g., about 1.7) lower than that of the unoxidized regions 1322 (e.g., about 3) in semiconductor layers 1320. Due to the different compositions of semiconductor layers 1320 and the oxidation rates that may be a function of the compositions (e.g., a function of x in $Al_xGa_{1-x}As$), oxide regions 1324 in different semiconductor layers 1320 may have different sizes or areas. As such, the volume and the lateral dimension of oxide regions 1324 after the selective oxidation treatment may be a function of the aluminum concentrations in semiconductor layers 1320, the duration of the selective oxidation treatment, as well as other parameters of the selective oxidation treatment, such as temperature, oxygen pressure, and the like.

Due to the controlled oxidation period and finite oxidation rates, the oxidation may only occur in certain lateral areas in semiconductor layers 1320, resulting in spatially variant oxidation of semiconductor layers 1320. In this way, oxide regions 1324 may be preferentially formed in semiconductor layers 1320 that have, for example, higher aluminum concentrations (e.g., larger x values). For example, in the example illustrated in FIG. 13A, the x value of $Al_xGa_{1-x}As$ in semiconductor layers 1320 may increase in the +z direction. Thus, after the oxidation treatment, oxide regions 1324 may gradually increase in the +z direction. For example, semiconductor layers 1320 near layer 1310 may have the lowest aluminum composition and thus the smallest oxide regions 1324 after the oxidation treatment, while semiconductor layers 1320 near layer 1340 may have higher aluminum concentrations and thus larger oxide regions 1324 after the oxidation treatment. Because oxide regions 1324 may have a different (e.g., lower) refractive index than the corresponding unoxidized region 1322 in semiconductor layers 1320, semiconductor layers 1320 may have a spatially variant effective refractive index in the x and/or y directions to form an effective convex-plano lens.

In some embodiments, semiconductor layers 1320 may include, for example, $(Al_xGa_{1-x})_{0.5}In_{0.5}P$, where x is the molar fraction of aluminum relative to gallium in each of semiconductor layers 1320. The value of x may be different in different semiconductor layers 1320 such that semiconductor layers 1320 may be laterally etched in different rates in a liquid solution including etchants, such as hydrochloric acid and/or sulfuric acid. As such, after a certain etching duration, different lateral regions of semiconductor layers 1320 may be removed, forming voids or air gaps in semiconductor layers 1320. Thus, semiconductor layers 1320 may function as a lens in the free space. Other materials that may be used in semiconductor layers 1320 include, for example, (AlGaIn)AsP, (AlGaIn)NAs, (AlGaIn)N, AlInGaAsSb, or the like.

FIG. 13B illustrates an example of a planar lens 1350 formed in multiple semiconductor layers 1370 according to certain embodiments. Semiconductor layers 1370 may be between a bottom layer 1360 (which may be similar to layer 1310) and a top layer 1380 (which may be similar to layer 1340). Semiconductor layers 1370 may include layers of semiconductor materials with different compositions and thus may have different lateral oxidation or etch rates as described above with respect to FIG. 13A. For example, semiconductor layers 1370 may include a plurality of $Al_xGa_{1-x}As$ layers or a plurality of $(Al_xGa_{1-x})_{0.5}In_{0.5}P$ layers. In some embodiments, the plurality of $Al_xGa_{1-x}As$ layers may be interleaved with a plurality of GaAs (or $Al_yGa_{1-y}As$) layers.

In the example shown in FIG. 13B, the x value for the plurality of $Al_xGa_{1-x}As$ layers may gradually decrease and then gradually increase in the z direction. As such, after the oxidation treatment, the top and bottom layers of the $Al_xGa_{1-x}As$ layers may include larger oxide regions that have a lower refractive index than the unoxidized regions. Thus, an effective bi-convex lens may be formed in the plurality of $Al_xGa_{1-x}As$ layers.

Figure 14:
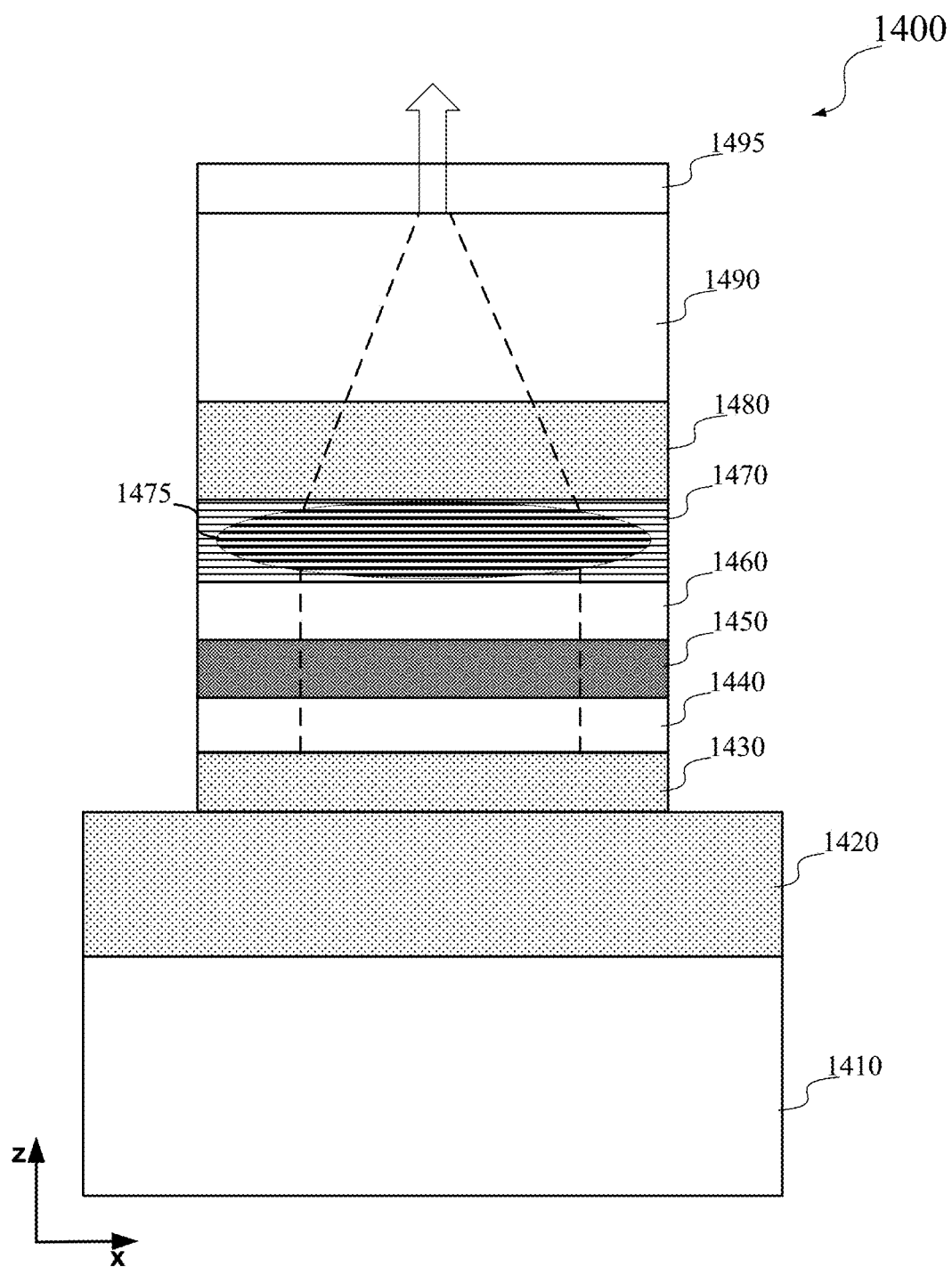
FIG. 14 illustrates an example of a light source including a planar lens and a nonlinear crystal according to certain embodiments.

FIG. 14 illustrates an example of a light source 1400 including a planar lens 1475 and a nonlinear crystal 1490 according to certain embodiments. Light source 1400 may be an example of light source 1200, and may include a VCSEL, RCLED, VECSEL, or the like. As illustrated, light source 1400 may include a substrate 1410, such as a GaAs substrate or a GaN substrate. A bulk DBR 1420 may be formed (e.g., epitaxially grown) on substrate 1410. Bulk DBR 1420 may include multiple interleaved layers of different materials that have different refractive indices, such as multiple pairs of AlGaAs/GaAs (or AlAs/GaAs) layers, and thus may reflect light at the interfaces between the adjacent material layers to achieve a high overall reflectivity. A bottom DBR 1430 may be formed on bulk DBR 1420 or may be part of bulk DBR 1420. Bottom DBR 1430 may similarly include multiple interleaved layers of different materials with different refractive indices. Light source 1400 may also include a cladding layer 1440, an active region 1450, and a cladding layer 1460, where cladding layers 1440 and 1460 may be p-doped or n-doped and may inject carriers into active region 1450. Active region 1450 may include one or more quantum wells or quantum dots, and QW barrier layers. Carriers may recombine in active region 1450 to emit photons of infrared light.

A plurality of layers 1470 for making a planar lens 1475 may be formed on cladding layer 1460 as described above with respect to FIGS. 13A and 13B. A top DBR 1480 may be epitaxially grown on layers 1470, and may be similar to bottom DBR 1430. Top DBR 1480 and bottom DBR 1430 (and bulk DBR 1420) may form a laser cavity that can confine photons. Bottom DBR 1430 and bulk DBR 1420 may have an overall reflectivity close to 100% to reflect all incident photons. Top DBR 1480 may have a reflectivity less than 100%, such that a portion of the emitted IR photons may be transmitted out of the laser cavity through top DBR 1480. Top DBR 1480, layers 1470, cladding layer 1460, active region 1450, cladding layer 1440, and bottom DBR 1430 may be vertically etched to form individual light sources on bulk DBR 1420 and substrate 1410. Lateral oxidation or etching may be performed to form planar lens 1475 as described above.

A thin layer of nonlinear crystal 1490 may be attached to top DBR 1480. Nonlinear crystal 1490 may include a crystal without inversion symmetry, such as $LiNbO_3$, $KNbO_3$, KTP, BBO, KDP, LBO, KTO, BTO, and the like. A selective reflection layer 1495 that reflects IR light and transmits visible light may be formed (e.g., coated or deposited) on nonlinear crystal 1490. The focal length and the location of planar lens 1475 may be configured such that planar lens 1475 may focus the IR light resonant in the laser cavity into nonlinear crystal 1490 to generate visible light due to the second order harmonic generation as described above.

Figure 15:
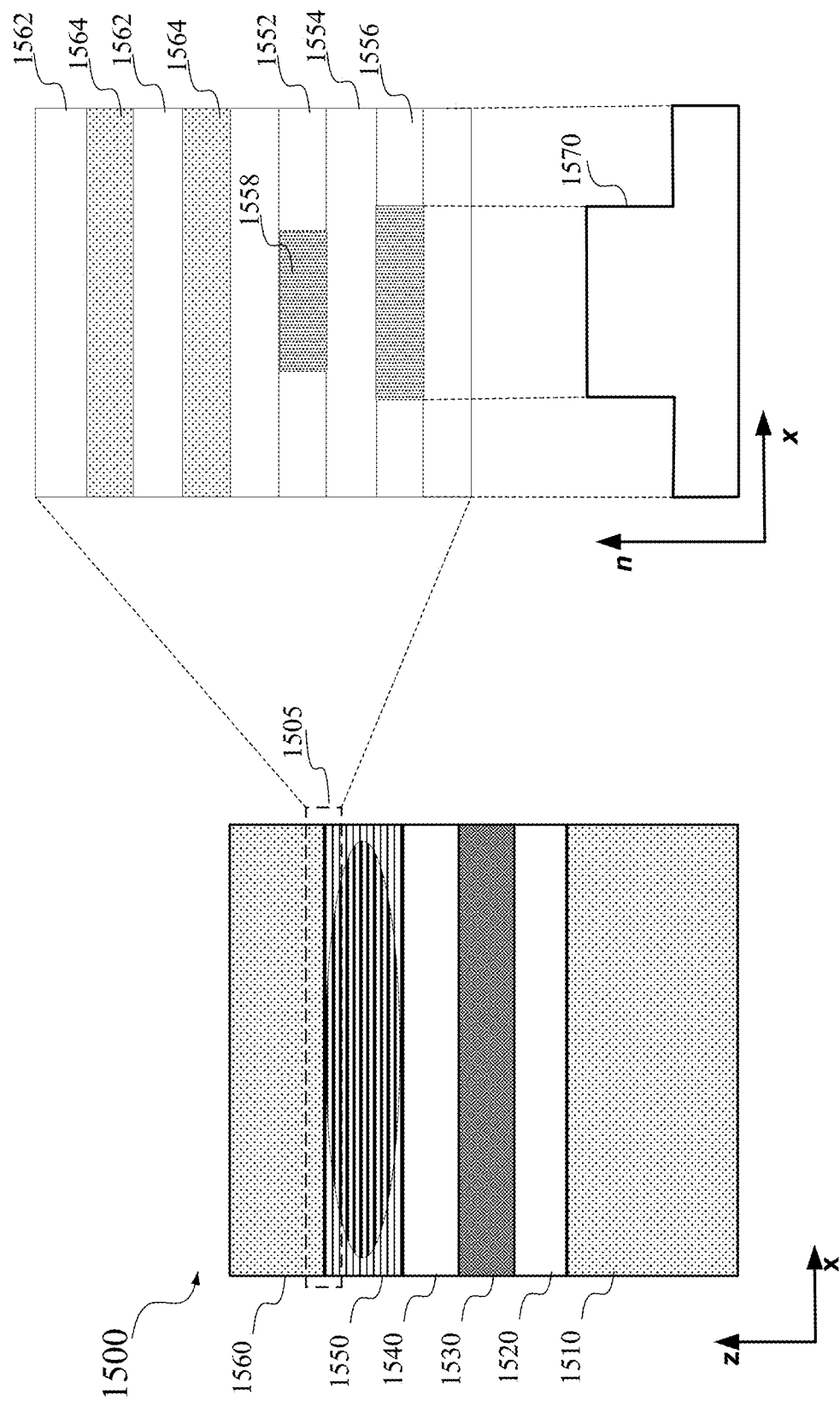
FIG. 15 illustrates an example of a portion of a light source including a planar lens and a cavity formed by distributed Bragg reflectors (DBRs) according to certain embodiments.

FIG. 15 illustrates an example of a portion of a light source 1500 including a planar lens and an optical cavity formed by distributed Bragg reflectors (DBRs) according to certain embodiments. Light source 1500 may be an example of light source 1400 or other light sources disclosed herein. The portion of light source 1500 shown in FIG. 15 may include a bottom DBR 1510, a cladding layer 1520, an active region 1530, a cladding layer 1540, a planar optical component 1550, and a top DBR 1560. As described above, bottom DBR 1510 and top DBR 1560 may include, for example, multiple pairs of AlGaAs/GaAs layers or multiple pairs of AlAs/GaAs layers. Bottom DBR 1510 may include more layers in order to achieve a high reflectivity, such as about 100%, for infrared light. Cladding layer 1520 and 1540 may include, for example, p- or n-doped AlGaAs. Active region 1530 may include multiple quantum well layers (e.g., InGaAs layers) and multiple QW barrier layers (e.g., GaAs layers). As described above, planar optical component 1550 may be formed in a plurality of semiconductor layers, such as a set of AlAs or AlGaAs layers, which may be interleaved with a set of GaAs layers. The plurality of semiconductor layers may have different compositions, such as different aluminum concentrations. The plurality of semiconductor layers may be oxidized for a period of time from the sidewalls. Due to the different compositions, different semiconductor layers may be oxidized at different rates and thus may include oxide regions of different respective sizes after the oxidation.

FIG. 15 also shows a small portion 1505 of light source 1500, which includes a portion of top DBR 1560 and a portion of planar optical component 1550. The portion of top DBR 1560 may include multiple pairs of layers. Each pair of layers may include a layer 1562 (e.g., GaAs) and a layer 1564 (e.g., AlGaAs) that have different refractive indices, such that light may be reflected at the interface between the two layers. Layer 1562 and layer 1564 may have certain thicknesses, such that the reflected light may constructively interfere to increase the total reflection. The small portion 1505 of planar optical component 1550 may also include multiple pairs of layers. Each pair of layers may include a layer 1552 (e.g., $Al_xGa_{1-x}As$) and a layer 1554 (e.g., GaAs). The concentrations of aluminum (e.g., value x) in different layers 1552 may be different. After a lateral oxidation period, regions 1556 of layers 1552 may be oxidized, while regions 1558 in the center of layers 1552 may not be oxidized. The oxidized region 1556 in a layer 1552 may have a lower refractive index than the corresponding region 1558. As such, the refractive index of a layer 1552 may vary in the x-direction as shown by a refractive index profile 1570.

Figure 16:
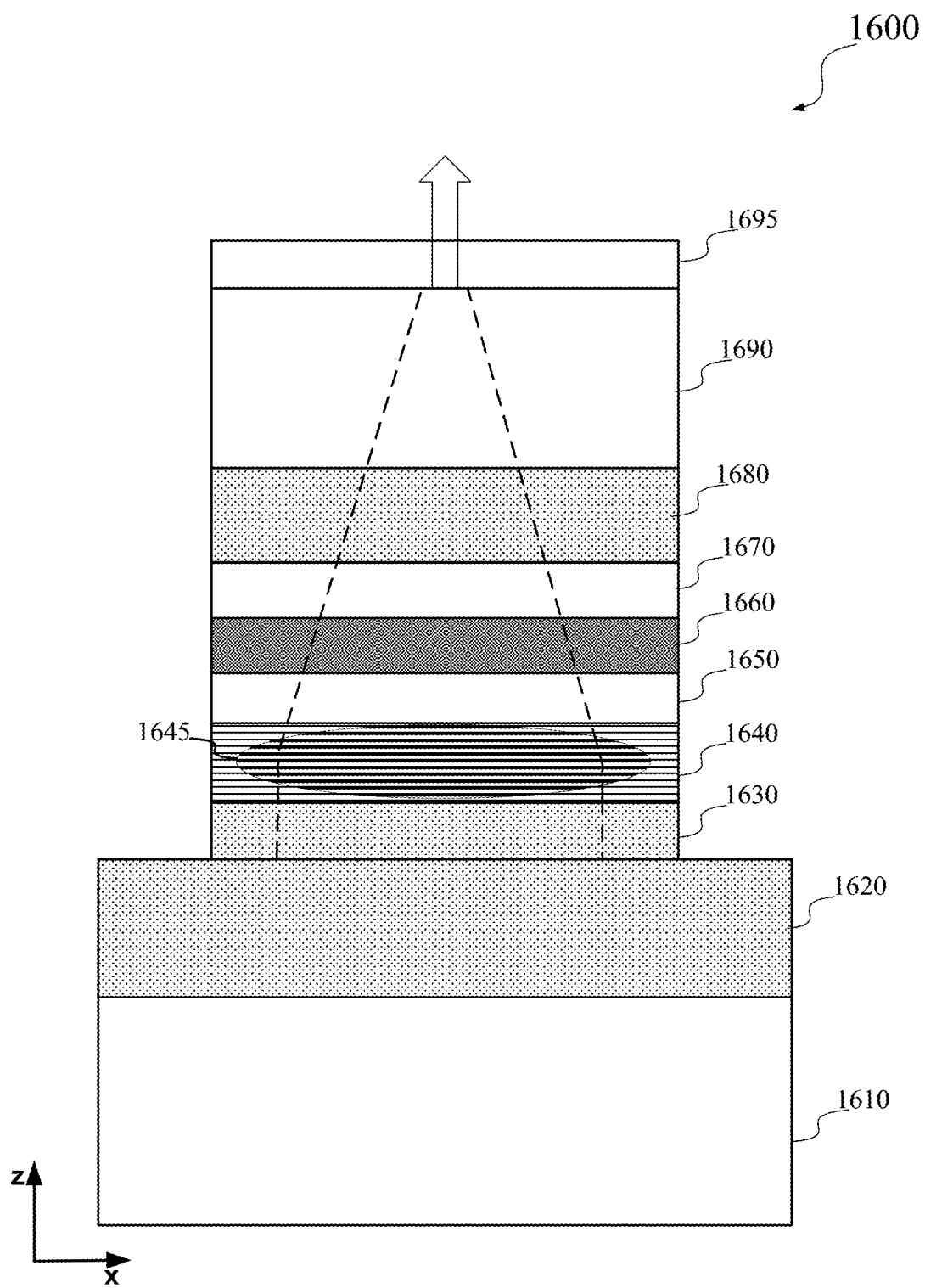
FIG. 16 illustrates an example of a light source including a planar lens and a nonlinear crystal according to certain embodiments.

FIG. 16 illustrates an example of a light source 1600 including a planar lens 1645 and a nonlinear crystal 1690 according to certain embodiments. Light source 1600 may be an example of light source 1200, and may include a visible light VCSEL, RCLED, VECSEL, or the like. As illustrated, light source 1600 may include a substrate 1610, such as a GaAs substrate or a GaN substrate. A bulk DBR 1620 may be formed (e.g., epitaxially grown) on substrate 1610. Bulk DBR 1620 may include multiple interleaved layers of different materials that have different refractive indices, such as multiple pairs of AlGaAs/GaAs or AlAs/GaAs layers, and thus may reflect light at the interfaces between adjacent layers to achieve a high overall reflectivity. A bottom DBR 1630 may be formed on bulk DBR 1620 or may be part of bulk DBR 1620. Bottom DBR 1630 may similarly include multiple interleaved layers of different materials with different refractive indices.

A plurality of semiconductor layers 1640 for making a planar lens 1645 may be epitaxially grown on bottom DBR 1630 as described above. A cladding layer 1650, an active region 1660, and a cladding layer 1670 may be epitaxially grown on semiconductor layers 1640. Cladding layers 1650 and 1670 may be p-doped or n-doped and may inject carriers into active region 1660. Active region 1660 may include one or more quantum wells or quantum dots, and QW barrier layers. Carriers injected into active region 1660 may recombine to emit photons of infrared light.

A top DBR 1680 may be formed on cladding layer 1670, and may be similar to bottom DBR 1630. Top DBR 1680 and bottom DBR 1630 (and bulk DBR 1620) may form a laser cavity that can confine photons. Bottom DBR 1630 and bulk DBR 1620 may have a reflectivity close to 100% to reflect all incident photons. Top DBR 1680 may have a reflectivity less than 100%, such that a portion of the emitted photons may be transmitted out of the laser cavity through top DBR 1680. Top DBR 1680, cladding layer 1670, active region 1660, cladding layer 1650, semiconductor layers 1640, and bottom DBR 1630 may be vertically etched to form individual visible light sources on bulk DBR 1620 and substrate 1610. Lateral oxidation or etching may be performed to form planar lens 1645 in layers 1640 as described above.

Nonlinear crystal 1690 may be attached to top DBR 1680. Nonlinear crystal 1690 may include a crystal without inversion symmetry, such as $LiNbO_3$, $KNbO_3$, KTP, BBO, KDP, LBO, KTO, BTO, and the like. A selective reflection layer 1695 that reflects IR light and transmits visible light may be formed (e.g., coated or deposited) on nonlinear crystal 1690. The focal length and the location of planar lens 1645 may be configured such that planar lens 1645 may focus the IR light resonant in the laser cavity into nonlinear crystal 1690 to generate visible light due to the second order harmonic generation as described above.

Figure 17:
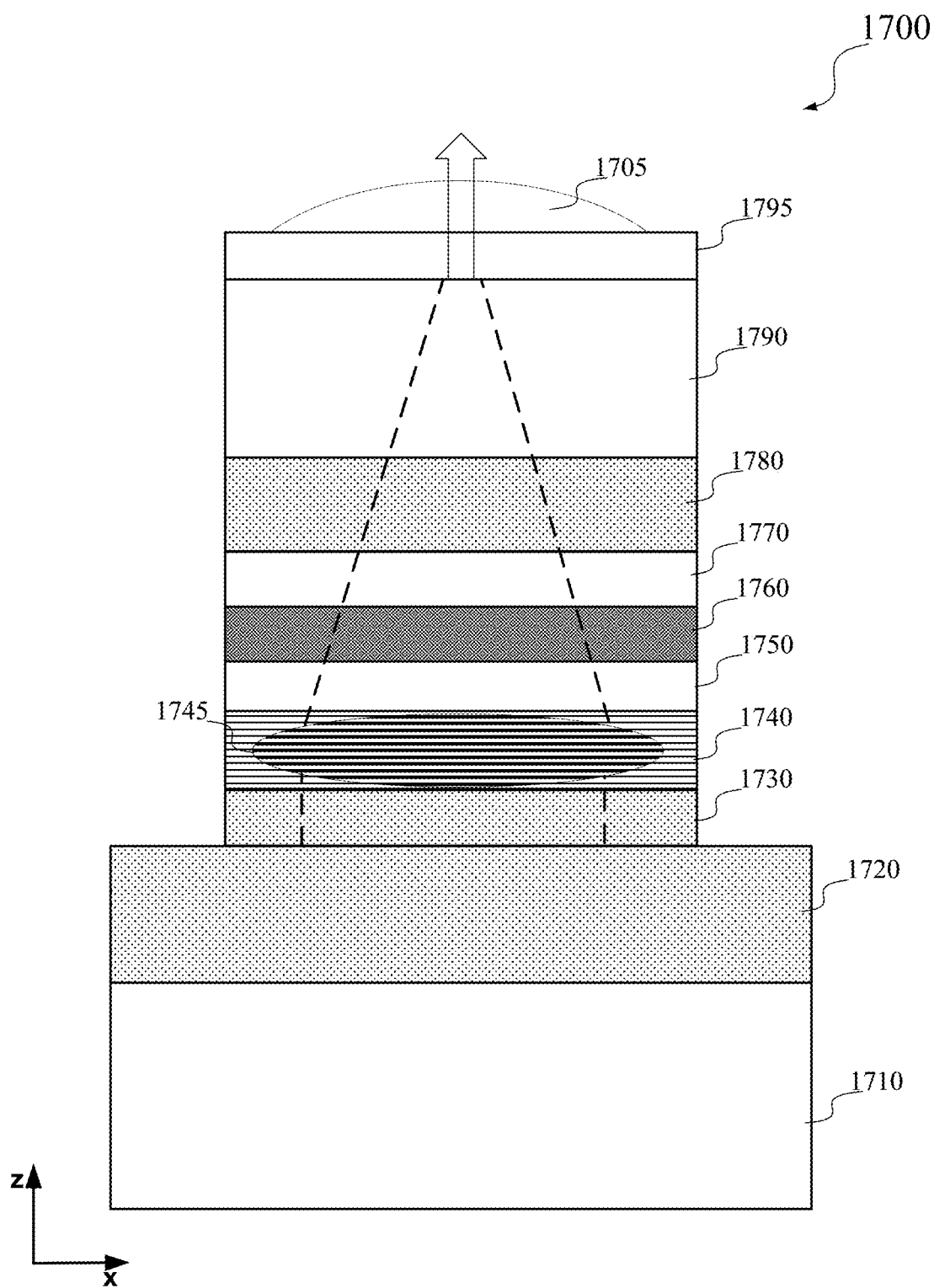
FIG. 17 illustrates an example of a light source including a planar lens, a nonlinear crystal, and an external lens according to certain embodiments.

FIG. 17 illustrates an example of a light source 1700 including a planar lens 1745, a nonlinear crystal 1790, and an external lens 1705 according to certain embodiments. Light source 1700 may include a substrate 1710, a bulk DBR 1720, a bottom DBR 1730, a plurality of semiconductor layers 1740 that form planar lens 1745, a cladding layer 1750, an active region 1760, a cladding layer 1770, a top DBR 1780, nonlinear crystal 1790, and a selective reflection layer 1795, which may correspond to substrate 1610, bulk DBR 1620, bottom DBR 1630, semiconductor layers 1640, cladding layer 1650, active region 1660, cladding layer 1670, top DBR 1680, nonlinear crystal 1690, and selective reflection layer 1695, respectively. In addition, light source 1700 may include external lens 1705 formed on selective reflection layer 1795. External lens 1705 may be used to extract visible light from the external cavity formed by selective reflection layer 1795 and top DBR 1780. External lens 1705 may also collimate, focus, or diverge the visible light extracted from the external cavity.

Figure 18:
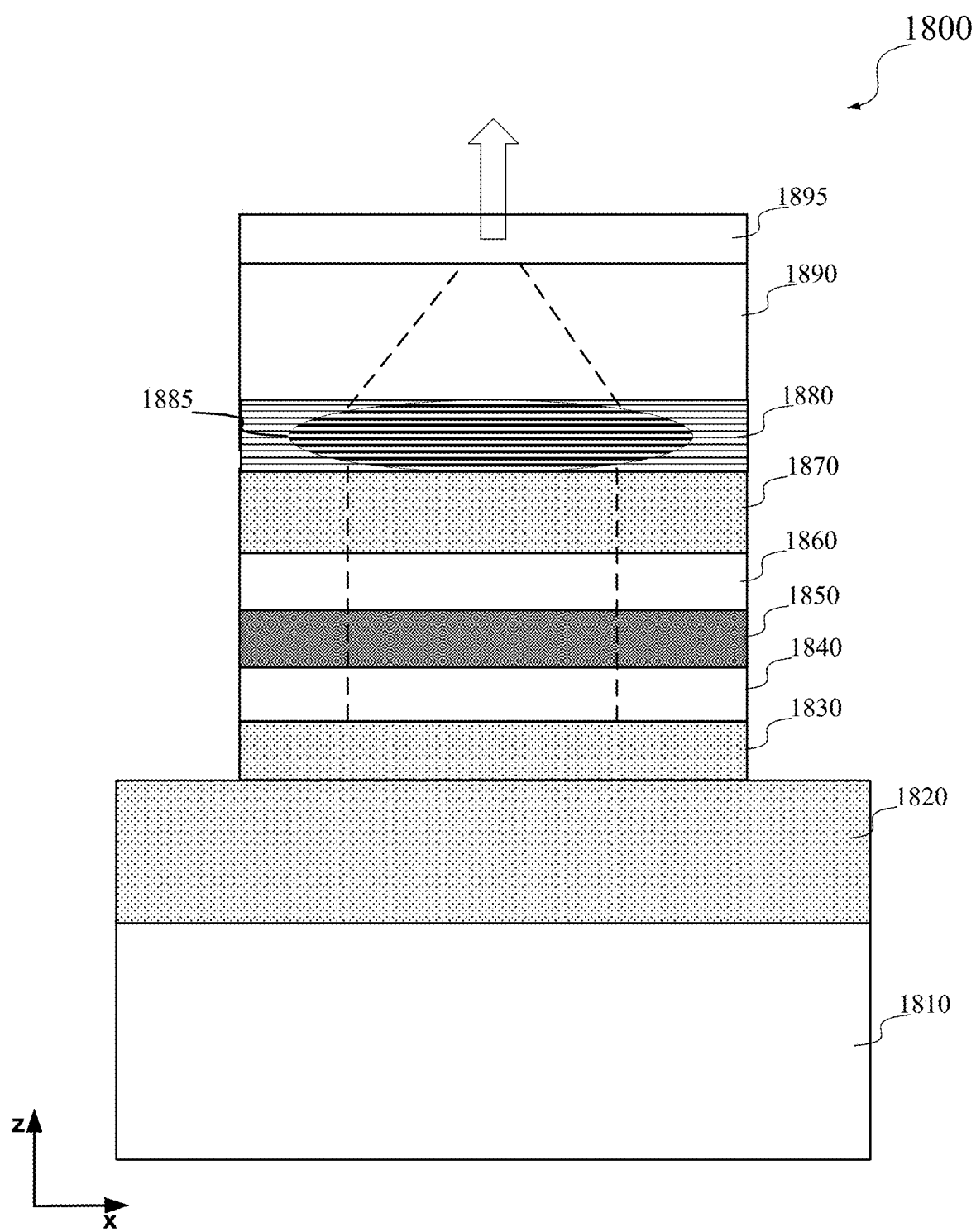
FIG. 18 illustrates an example of a light source including a planar lens and a nonlinear crystal according to certain embodiments.

FIG. 18 illustrates an example of a light source 1800 including a planar lens 1885 and a nonlinear crystal 1890 according to certain embodiments. Light source 1800 may be an example of light source 1200, and may include a visible light VCSEL, RCLED, VECSEL, or the like. As illustrated, light source 1800 may include a substrate 1810, such as a GaAs substrate or a GaN substrate. A bulk DBR 1820 may be formed (e.g., epitaxially grown) on substrate 1810. Bulk DBR 1820 may include multiple interleaved layers of different materials that have different refractive indices, such as multiple pairs of AlGaAs/GaAs or AlAs/GaAs layers, and thus may reflect light at the interfaces between adjacent layers to achieve a high overall reflectivity. A bottom DBR 1830 may be formed on bulk DBR 1820 or may be part of bulk DBR 1820. Bottom DBR 1830 may similarly include multiple interleaved layers of different materials with different refractive indices and may be similarly grown.

A cladding layer 1840, an active region 1850, and a cladding layer 1860 may be epitaxially grown on bottom DBR 1830. Cladding layers 1840 and 1860 may be p-doped or n-doped and may inject carriers into active region 1850. Active region 1850 may include one or more quantum wells or quantum dots, and quantum well barrier layers. Carriers injected into active region 1850 may recombine in active region 1850 to emit photons of infrared light.

A top DBR 1870 may be formed on cladding layer 1860, and may be similar to bottom DBR 1830. Top DBR 1870 and bottom DBR 1830 (and bulk DBR 1820) may form a laser cavity that can confine photons. Bottom DBR 1830 and bulk DBR 1820 may have a reflectivity close to 100% to reflect all incident photons. Top DBR 1870 may have a reflectivity less than 100%, such that a portion of the emitted photons may be transmitted out of the laser cavity through top DBR 1870.

A plurality of layers 1880 for making planar lens 1885 may be formed on top DBR 1870 as described above. Layers 1880, top DBR 1870, cladding layer 1860, active region 1850, cladding layer 1840, and bottom DBR 1830 may be vertically etched to form individual light sources on bulk DBR 1820 and substrate 1810. Lateral oxidation or etching of layers 1880 may then be performed from the exposed sidewalls of layers 1880 to form planar lens 1885 in layers 1880 as described above.

Nonlinear crystal 1890 may be attached to layers 1880. Nonlinear crystal 1890 may include a crystal without inversion symmetry, such as $LiNbO_3$, $KNbO_3$, KTP, BBO, KDP, LBO, KTO, BTO, and the like. A selective reflection layer 1895 that reflects IR light and transmits visible light may be formed (e.g., coated or deposited) on nonlinear crystal 1890. The focal length and the location of planar lens 1885 may be configured such that planar lens 1885 may focus the IR light transmitted from top DBR 1870 of the laser cavity into nonlinear crystal 1890, where the beam waist of the IR light may be at or near the interface between nonlinear crystal 1890 and selective reflection layer 1895. The focused IR light in nonlinear crystal 1890 may be converted to visible light by the second order harmonic generation caused by the nonlinear effect and the high intensity of the focused IR light as described above. The visible light may be transmitted out of light source 1800 through selective reflection layer 1895.

In some embodiments, top DBR 1870 may not be used. The resonant cavity for IR light may be formed by bottom DBR 1830 and selective reflection layer 1895. Thus, nonlinear crystal 1890 may be in the resonant cavity, and planar lens 1885 may focus or collimate the IR light that propagates back and forth in the resonant cavity such that the beam waist of the IR light may be near or at the interface between selective reflection layer 1895 and nonlinear crystal 1890, where visible light may be generated due to the nonlinear effect of nonlinear crystal 1890 and the high IR light intensity at the beam waist.

In some embodiments, the planar lens may include a GRIN lens formed in the nonlinear crystal. The GRIN lens may have a laterally varying refractive index, where the refractive index may be the highest at the center and may gradually reduce as the distance from the center increases to form a positive lens. The nonlinear crystal may be modified to have a horizontally varying refractive index by, for example, doping, deposition, or ion exchange, before being attached to the semiconductor layers.

FIG. 19 is a flowchart 1900 illustrating an example of a process of fabricating a visible light emitter array, such as an array of visible light VCSELs, VECSELs, RCLEDs, or the like, according to certain embodiments. The operations described in flowchart 1900 are for illustration purposes only and are not intended to be limiting. In various implementations, modifications may be made to flowchart 1900 to add additional operations, omit some operations, combine some operations, split some operations, or reorder some operations.

Operation 1910 may be performed at a wafer level to fabricate an engineered wafer including a stack of semiconductor layers. Operation 1910 may include depositing the stack of semiconductor layers on a substrate. The stack of semiconductor layers may form a light emitting cavity, and may include a plurality of semiconductor layers having different compositions and susceptible to different oxidation rates (or etch rates) in or on the light emitting cavity. For example, as described above with respect to FIGS. 12-18, the stack of semiconductor layers may be epitaxially grown on a substrate, such as a GaAs substrate or a GaN substrate, using MBE, CVD, MOCVD, LPE, or other techniques.

The stack of semiconductor layers may include a set of semiconductor layers that form a bottom DBR, a bottom cladding layer, active semiconductor layers that form multiple quantum wells or quantum dots and emit IR light, a top cladding layer, and a set of semiconductor layers that form a top DBR. The top and bottom DBRs may include multiple interleaved layers of different materials that have different refractive indices, such as multiple pairs of AlGaAs/GaAs or AlAs/GaAs layers, and thus may reflect light at the interfaces between adjacent layers to achieve a high overall reflectivity. The thicknesses of the interleaved layers may be selected such that the reflected IR light may constructively interfere to achieve the high overall reflectivity. The cladding layers may include, for example, p-doped or n-doped AlGaAs, and may inject carriers into the active semiconductor layers. The active semiconductor layers may include quantum well layers (e.g., InGaAs layers) and QW barrier layers (e.g., GaAs layers), and may emit IR light when carriers injected into the active semiconductor layers (e.g., quantum well layers) recombine and emit photons. The bottom DBR, the bottom cladding layer, the active semiconductor layers, the top cladding layer, and the top DBR may form a resonant cavity, where only optical waves of certain modes may be sustained, while other optical modes may be suppressed. The bottom DBR may include more layers and may achieve a reflectivity close to 100% to reflect all incident photons. The top DBR may include fewer layers and may have a reflectivity less than 100%, such that a portion of the IR photons emitted in the active semiconductor layers may be transmitted out of the resonant cavity through the top DBR.

As described above, the stack of semiconductor layers may also include a plurality of semiconductor layers that can be laterally oxidized or laterally etched to form a planar optical component, such as a lens. The plurality of semiconductor layers may include, for example, $Al_xGa_{1-x}As$, $(Al_xGa_{1-x})_{0.5}In_{0.5}P$, (AlGaIn)AsP, (AlGaIn)NAs, (AlGaIn)N, AlInGaAsSb, or the like. The composition of the plurality of semiconductor layers may vary. For example, the plurality of semiconductor layers may have different aluminum concentrations, and thus may have different lateral oxidation rates or etch rates. The composition of each of the plurality of semiconductor layers can be controlled by, for example, the amount of each reactant used in the epitaxial growth or the doping level of a dopant. The plurality of semiconductor layers may be grown between the top DBR and the bottom DBR in the resonant cavity, or may be outside of the resonant cavity. For example, as shown in FIGS. 12 and 14-17, the plurality of semiconductor layers may be between a DBR and a cladding layer. In the example shown in FIG. 18, the plurality of semiconductor layers may be epitaxially grown on the top DBR.

Operation 1920 may include etching the stack of semiconductor layers to form individual light sources. The sidewalls of the individual light sources may be exposed by the etching. Thus, the plurality of semiconductor layers for forming the planar optical components may be exposed at the sidewalls.

Operation 1930 may include lateral oxidation or etching of the plurality of semiconductor layers from the exposed sidewalls. The lateral oxidation or etching may be performed by exposing the sidewalls of the semiconductor layers to oxidizing agents (e.g., oxygen) or etchants (e.g., acids). The oxidation or etching of each semiconductor layer may start at the exposed sidewalls and progress laterally towards the center region. As described above in reference to FIGS. 13A-18, due to the different compositions or doping levels of the semiconductor layers, the lateral oxidation rate or the lateral etch rate may vary among the semiconductor layers. Thus, after an oxidation or etching period, different lateral oxide or void regions may be formed in the semiconductor layers, which may result in spatially variant effective optical path length in the semiconductor layers.

Operation 1940 may include coupling a nonlinear crystal to the stack of semiconductor layers. For example, the nonlinear crystal may be in the form of a wafer, a plate, or a thin film, and may be laminated, bonded, or otherwise attached on top of the stack of semiconductor layers that includes individual light sources etched therein. The nonlinear crystal may include a crystal without inversion symmetry, such as $LiNbO_3$, $KNbO_3$, KTP, BBO, KDP, LBO, KTO, BTO, and the like, and may have a high nonlinear coefficient (e.g., $\chi^{(2)}$) for second harmonic generation or frequency doubling.

Operation 1950 may include depositing a selective reflection layer on the nonlinear crystal. The selective reflection layer may have a high reflectivity for IR light and a low reflectivity for visible light, such that IR light may be reflected and visible light may be transmitted by the selective reflection layer. For example, the selective reflection layer may include an optical filter that can reflect IR light and allow visible light to pass through. Thus, an external cavity for IR light may be formed by the selective reflection layer and the top DBR. The selective reflection layer may also include an anti-reflection layer for visible light.

Operation 1960 may include forming an array of micro-lenses on the selective reflection layer. In some embodiments, the array of micro-lenses may be bonded to the selective reflection layer. In some embodiments, the array of micro-lenses may be formed by, for example, molding or photolithography (e.g., using a gray-scale mask). In some embodiments, the array of micro-lenses may be formed by depositing a transparent dielectric material layer (e.g., an oxide layer) on the selective reflection layer and etching the transparent dielectric material layer. The micro-lenses may be used to extract visible light from the external cavity formed by the selective reflection layer. The micro-lenses may also collimate, focus, or diverge the visible light extracted from the external cavity.

Figure 20:
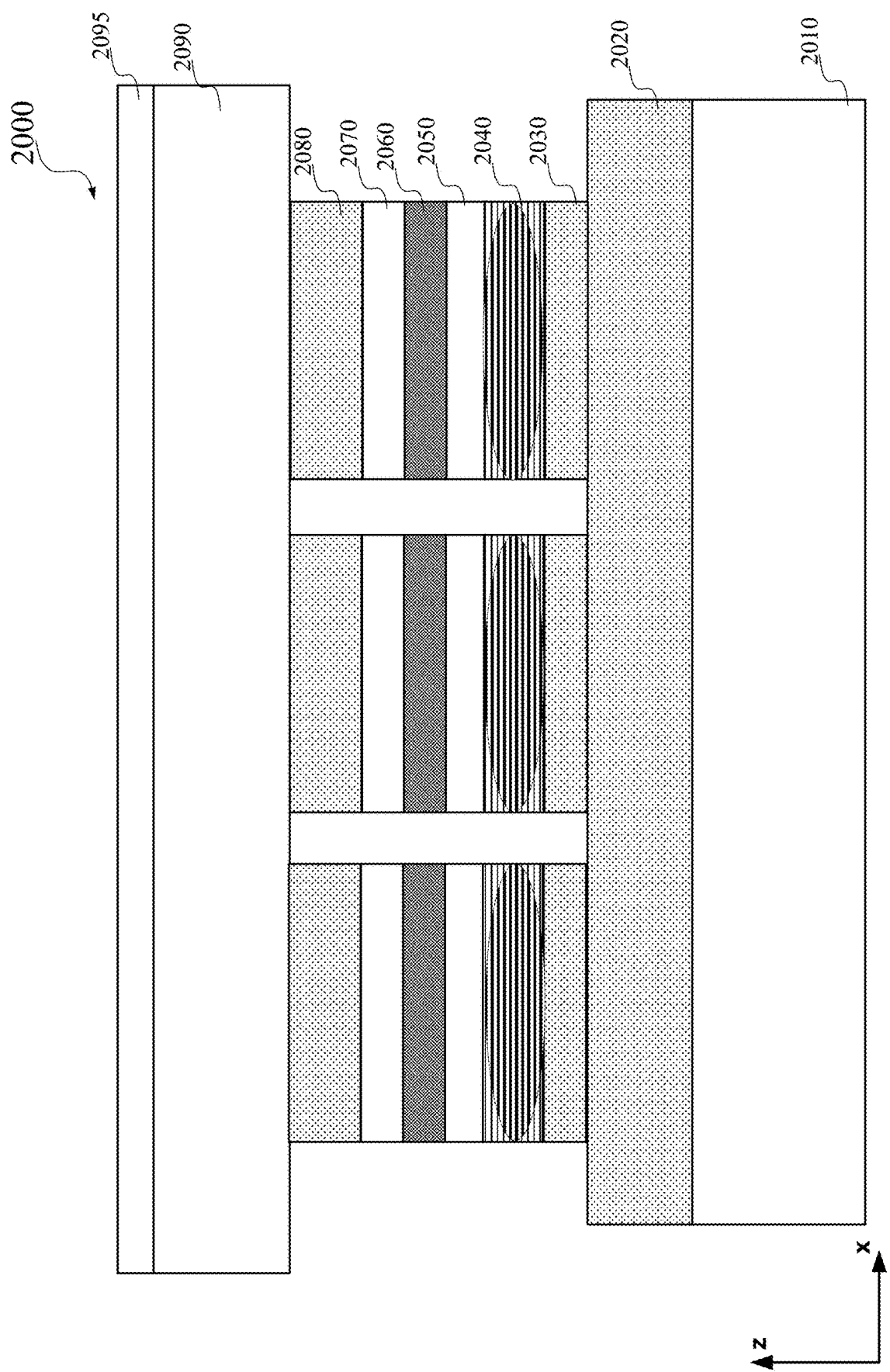
FIG. 20 illustrates an example of an array of light sources according to certain embodiments.

FIG. 20 illustrates an example of an array of light sources 2000 according to certain embodiments. The array of light sources 2000 may be fabricated on a die or a wafer by operations 1910-1950 described above with respect to FIG. 19. Each light source in the array of light sources 2000 may be an example of light source 1600. The array of light sources 2000 may include a substrate 2010 (e.g., a GaAs wafer), a bulk DBR 2020, a plurality of IR light lasers, a nonlinear crystal 2090 on the plurality of IR light lasers, and a selective reflection layer 2095 on nonlinear crystal 2090. As described above with respect to FIG. 16, each IR light laser may include a bottom DBR 2030, a planar lens 2040, a cladding layer 2050, an active region 2060, a cladding layer 2070, and a top DBR 2080. As described above with respect to FIG. 19, the IR light lasers may be formed by vertically etching a stack of semiconductor layers grown on substrate 2010.

Figure 21:
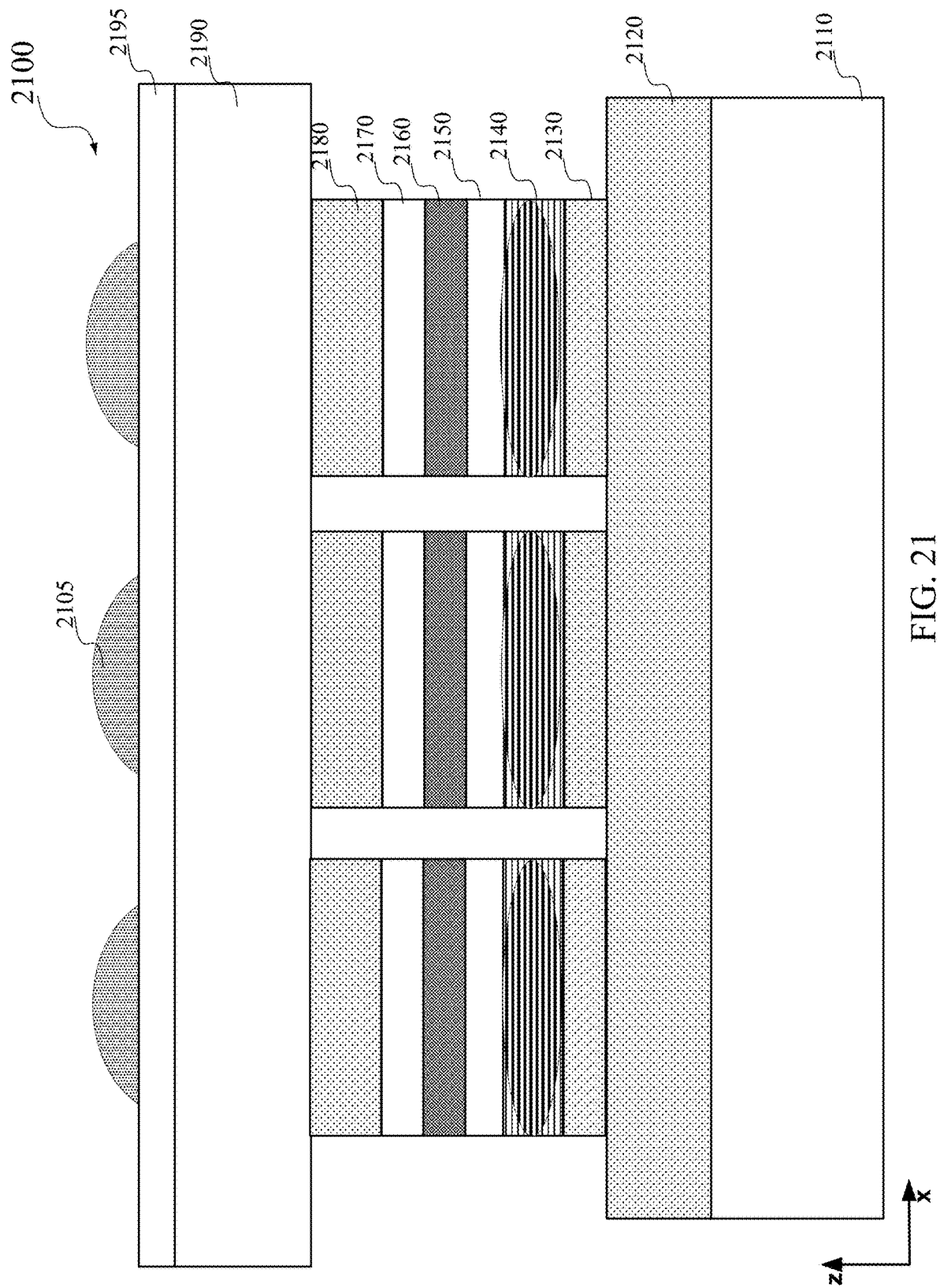
FIG. 21 illustrates an example of an array of light sources according to certain embodiments.

FIG. 21 illustrates an example of an array of light sources 2100 according to certain embodiments. The array of light sources 2100 may be fabricated on a die or a wafer by operations 1910-1960 described above with respect to FIG. 19. Each light source in the array of light sources 2100 may be an example of light source 1700. The array of light sources 2100 may include a substrate 2110 (e.g., a GaAs wafer), a bulk DBR 2120, a plurality of IR light lasers, a nonlinear crystal 2190 on the plurality of IR light lasers, a selective reflection layer 2195 on nonlinear crystal 2190, and an array of micro-lenses 2105 on selective reflection layer 2195. As described above with respect to FIGS. 16 and 17, each IR light laser may include a bottom DBR 2130, a planar lens 2140, a cladding layer 2150, an active region 2160, a cladding layer 2170, and a top DBR 2180. The IR light lasers may be formed by vertically etching a stack of semiconductor layers grown on substrate 2110. The array of micro-lenses 2105 may be aligned with the plurality of IR light lasers to extract, collimate, focus, or diverge the visible light generated in nonlinear crystal 2190. In the illustrated example, each micro-lens 2105 may correspond to one IR light laser.

One or two-dimensional arrays of the light sources described above may be manufactured on a wafer to form light sources (e.g., light source 642). Driver circuits (e.g., driver circuit 644) may be fabricated, for example, on a silicon wafer using CMOS processes. The light source and the driver circuits on wafers may be diced and then bonded together, or may be bonded on the wafer level and then diced. Various bonding techniques can be used for bonding the light sources and the driver circuits, such as adhesive bonding, metal-to-metal bonding, metal oxide bonding, wafer-to-wafer bonding, die-to-wafer bonding, hybrid bonding, and the like.

FIG. 22A illustrates an example of a method of die-to-wafer bonding for arrays of semiconductor light sources, such as LEDs or VCSELs, according to certain embodiments. In the example shown in FIG. 22A, an LED array 2201 may include a plurality of LEDs 2207 on a carrier substrate 2205. Carrier substrate 2205 may include various materials, such as GaAs, InP, GaN, AlN, sapphire, SiC, Si, or the like. LEDs 2207 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 2203 may include a base layer 2209 having passive or active integrated circuits (e.g., driver circuits 2211) fabricated thereon. Base layer 2209 may include, for example, a silicon wafer. Driver circuits 2211 may be used to control the operations of LEDs 2207. For example, the driver circuit for each LED 2207 may include a 2T1C pixel structure that has two transistors and one capacitor. Wafer 2203 may also include a bonding layer 2213. Bonding layer 2213 may include various materials, such as a metal, an oxide, a dielectric, CuSn, AuTi, and the like. In some embodiments, a patterned layer 2215 may be formed on a surface of bonding layer 2213, where patterned layer 2215 may include a metallic grid made of a conductive material, such as Cu, Ag, Au, Al, or the like.

LED array 2201 may be bonded to wafer 2203 via bonding layer 2213 or patterned layer 2215. For example, patterned layer 2215 may include metal pads or bumps made of various materials, such as CuSn, AuSn, or nanoporous Au, that may be used to align LEDs 2207 of LED array 2201 with corresponding driver circuits 2211 on wafer 2203. In one example, LED array 2201 may be brought toward wafer 2203 until LEDs 2207 come into contact with respective metal pads or bumps corresponding to driver circuits 2211. Some or all of LEDs 2207 may be aligned with driver circuits 2211, and may then be bonded to wafer 2203 via patterned layer 2215 by various bonding techniques, such as metal-to-metal bonding. After LEDs 2207 have been bonded to wafer 2203, carrier substrate 2205 may be removed from LEDs 2207.

FIG. 22B illustrates an example of a method of wafer-to-wafer bonding for arrays of semiconductor light sources, such as LEDs or VCSELs, according to certain embodiments. As shown in FIG. 22B, a first wafer 2202 may include a substrate 2204, a first semiconductor layer 2206, active layers 2208, and a second semiconductor layer 2210. Substrate 2204 may include various materials, such as GaAs, InP, GaN, AlN, sapphire, SiC, Si, or the like. First semiconductor layer 2206, active layers 2208, and second semiconductor layer 2210 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 2206 may be an n-type layer, and second semiconductor layer 2210 may be a p-type layer. For example, first semiconductor layer 2206 may be an n-doped GaN layer (e.g., doped with Si or Ge), and second semiconductor layer 2210 may be a p-doped GaN layer (e.g., doped with Mg, Ca, Zn, or Be). Active layers 2208 may include, for example, one or more GaN layers, one or more InGaN layers, one or more AlInGaP layers, and the like, which may form one or more heterostructures, such as one or more quantum wells or MQWs.

In some embodiments, first wafer 2202 may also include a bonding layer. Bonding layer 2212 may include various materials, such as a metal, an oxide, a dielectric, CuSn, AuTi, or the like. In one example, bonding layer 2212 may include p-contacts and/or n-contacts (not shown). In some embodiments, other layers may also be included on first wafer 2202, such as a buffer layer between substrate 2204 and first semiconductor layer 2206. The buffer layer may include various materials, such as polycrystalline GaN or AlN. In some embodiments, a contact layer may be between second semiconductor layer 2210 and bonding layer 2212. The contact layer may include any suitable material for providing an electrical contact to second semiconductor layer 2210 and/or first semiconductor layer 2206.

First wafer 2202 may be bonded to wafer 2203 that includes driver circuits 2211 and bonding layer 2213 as described above, via bonding layer 2213 and/or bonding layer 2212. Bonding layer 2212 and bonding layer 2213 may be made of the same material or different materials. Bonding layer 2213 and bonding layer 2212 may be substantially flat. First wafer 2202 may be bonded to wafer 2203 by various methods, such as metal-to-metal bonding, eutectic bonding, metal oxide bonding, anodic bonding, thermo-compression bonding, ultraviolet (UV) bonding, and/or fusion bonding.

As shown in FIG. 22B, first wafer 2202 may be bonded to wafer 2203 with the p-side (e.g., second semiconductor layer 2210) of first wafer 2202 facing down (i.e., toward wafer 2203). After bonding, substrate 2204 may be removed from first wafer 2202, and first wafer 2202 may then be processed from the n-side. The processing may include, for example, the formation of certain mesa shapes for individual LEDs, as well as the formation of optical components corresponding to the individual LEDs.

FIGS. 23A-23D illustrate an example of a method of hybrid bonding for arrays of semiconductor light sources, such as LEDs and VCSELs, according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 23A shows a substrate 2310 with passive or active circuits 2320 manufactured thereon. As described above with respect to FIGS. 8A-8B, substrate 2310 may include, for example, a silicon wafer. Circuits 2320 may include driver circuits for the arrays of LEDs. A bonding layer may include dielectric regions 2340 and contact pads 2330 connected to circuits 2320 through electrical interconnects 2322. Contact pads 2330 may include, for example, Cu, Ag, Au, Al, W, Mo, Ni, Ti, Pt, Pd, or the like. Dielectric materials in dielectric regions 2340 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 2305. The activated surface may be atomically clean and may be reactive for formation of direct bonds between wafers when they are brought into contact, for example, at room temperature.

FIG. 23B illustrates a wafer 2350 including an array of micro-LEDs 2370 fabricated thereon as described above with respect to, for example, FIGS. 7A-8B. Wafer 2350 may be a carrier wafer and may include, for example, GaAs, InP, GaN, AlN, sapphire, SiC, Si, or the like. Micro-LEDs 2370 may include an n-type layer, an active region, and a p-type layer epitaxially grown on wafer 2350. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 2380 and n-contacts 2382 may be formed in a dielectric material layer 2360 deposited on the mesa structures and may make electrical contacts with the p-type layer and the n-type layers, respectively. Dielectric materials in dielectric material layer 2360 may include, for example, SiCN, $SiO_2$, SiN, $Al_2O_3$, $HfO_2$, $ZrO_2$, $Ta_2O_5$, or the like. P-contacts 2380 and n-contacts 2382 may include, for example, Cu, Ag, Au, Al, W, Mo, Ni, Ti, Pt, Pd, or the like. The top surfaces of p-contacts 2380, n-contacts 2382, and dielectric material layer 2360 may form a bonding layer. The bonding layer may be planarized and polished using, for example, chemical mechanical polishing, where the polishing may cause dishing in p-contacts 2380 and n-contacts 2382. The bonding layer may then be cleaned and activated by, for example, an ion (e.g., plasma) or fast atom (e.g., Ar) beam 2315. The activated surface may be atomically clean and reactive for formation of direct bonds between wafers when they are brought into contact, for example, at room temperature.

FIG. 23C illustrates a room temperature bonding process for bonding the dielectric materials in the bonding layers. For example, after the bonding layer that includes dielectric regions 2340 and contact pads 2330 and the bonding layer that includes p-contacts 2380, n-contacts 2382, and dielectric material layer 2360 are surface activated, wafer 2350 and micro-LEDs 2370 may be turned upside down and brought into contact with substrate 2310 and the circuits formed thereon. In some embodiments, compression pressure 2325 may be applied to substrate 2310 and wafer 2350 such that the bonding layers are pressed against each other. Due to the surface activation and the dishing in the contacts, dielectric regions 2340 and dielectric material layer 2360 may be in direct contact because of the surface attractive force, and may react and form chemical bonds between them because the surface atoms may have dangling bonds and may be in unstable energy states after the activation. Thus, the dielectric materials in dielectric regions 2340 and dielectric material layer 2360 may be bonded together with or without heat treatment or pressure.

FIG. 23D illustrates an annealing process for bonding the contacts in the bonding layers after bonding the dielectric materials in the bonding layers. For example, contact pads 2330 and p-contacts 2380 or n-contacts 2382 may be bonded together by annealing at, for example, about 200-400° C. or higher. During the annealing process, heat 2335 may cause the contacts to expand more than the dielectric materials (due to different coefficients of thermal expansion), and thus may close the dishing gaps between the contacts such that contact pads 2330 and p-contacts 2380 or n-contacts 2382 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 24:
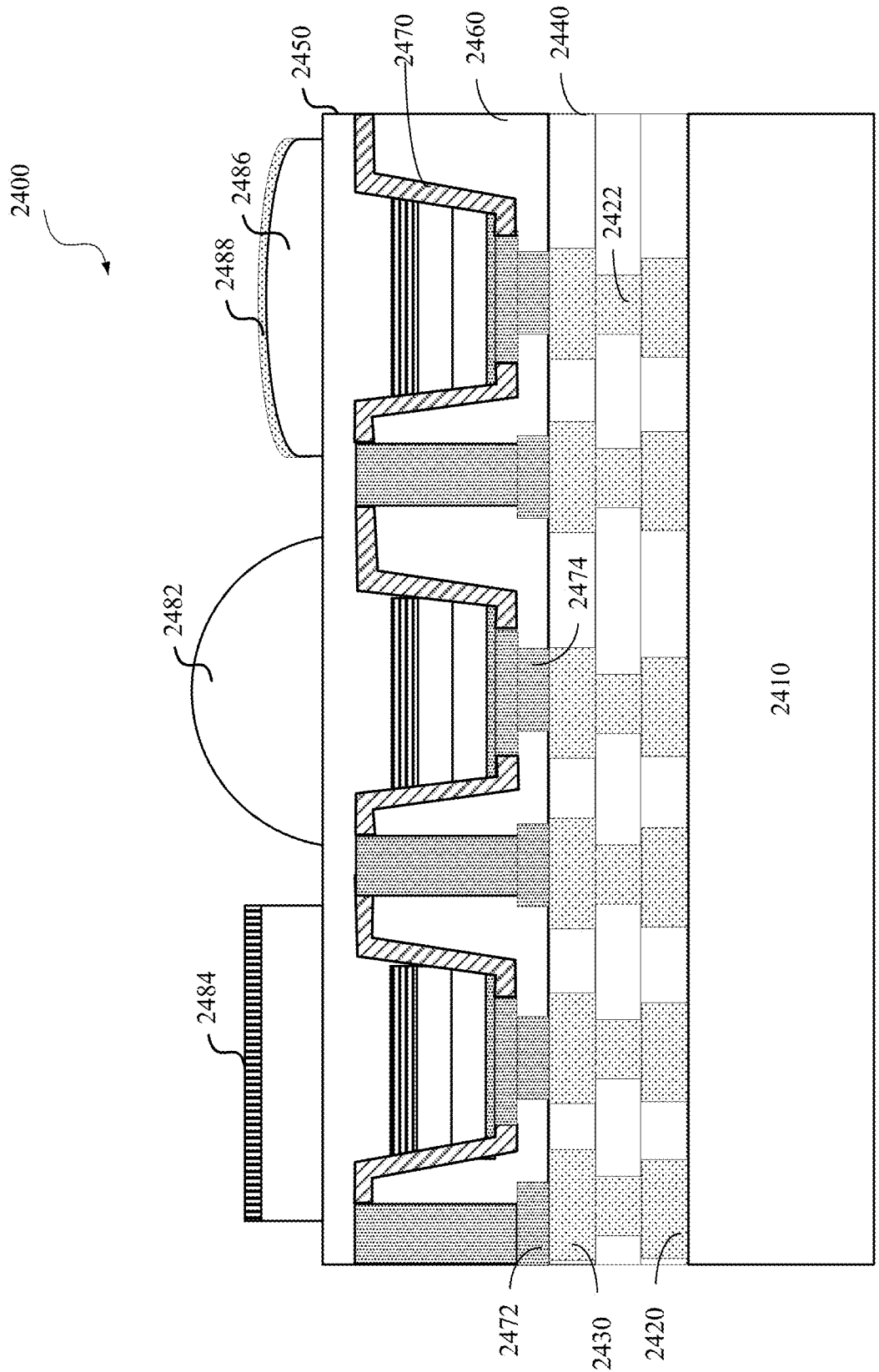
FIG. 24 illustrates an example of an array of semiconductor light sources with secondary optical components fabricated thereon according to certain embodiments.

FIG. 24 illustrates an example of an array of semiconductor light sources, such as LEDs and VCSELs, with secondary optical components fabricated thereon according to certain embodiments. In the illustrated example, an LED array 2400 may be made by bonding an LED chip or wafer with a silicon wafer including electrical circuits fabricated thereon, using any suitable bonding techniques described above with respect to, for example, FIGS. 22A-23D. In the example shown in FIG. 24, LED array 2400 may be bonded using a wafer-to-wafer hybrid bonding technique as described above with respect to FIG. 23A-23D. LED array 2400 may include a substrate 2410, which may be, for example, a silicon wafer. Integrated circuits 2420, such as LED driver circuits, may be fabricated on substrate 2410. Integrated circuits 2420 may be connected to p-contacts 2474 and n-contacts 2472 of micro-LEDs 2470 through interconnects 2422 and contact pads 2430, where contact pads 2430 may form metallic bonds with p-contacts 2474 and n-contacts 2472. Dielectric layer 2440 on substrate 2410 may be bonded to dielectric layer 2460 through fusion bonding.

The substrate (not shown) of the LED chip or wafer may be thinned or may be removed to expose the n-type layer 2450 of micro-LEDs 2470. Various secondary optical components, such as a spherical micro-lens 2482, a grating 2484, a micro-lens 2486, an antireflection layer 2488, and the like, may be formed in or on top of n-type layer 2450. For example, spherical micro-lens arrays may be etched in the semiconductor materials of micro-LEDs 2470 using a grayscale mask and a photoresist with a linear response to exposure light, or using an etch mask formed by thermal reflowing of a patterned photoresist layer. The secondary optical components may also be etched in a dielectric layer deposited on n-type layer 2450 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, a micro-LED 2470 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 24 to show some examples of secondary optical components that can be formed on micro-LEDs 2470, which does not necessary imply that different secondary optical components are used simultaneously for every LED array.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 25:
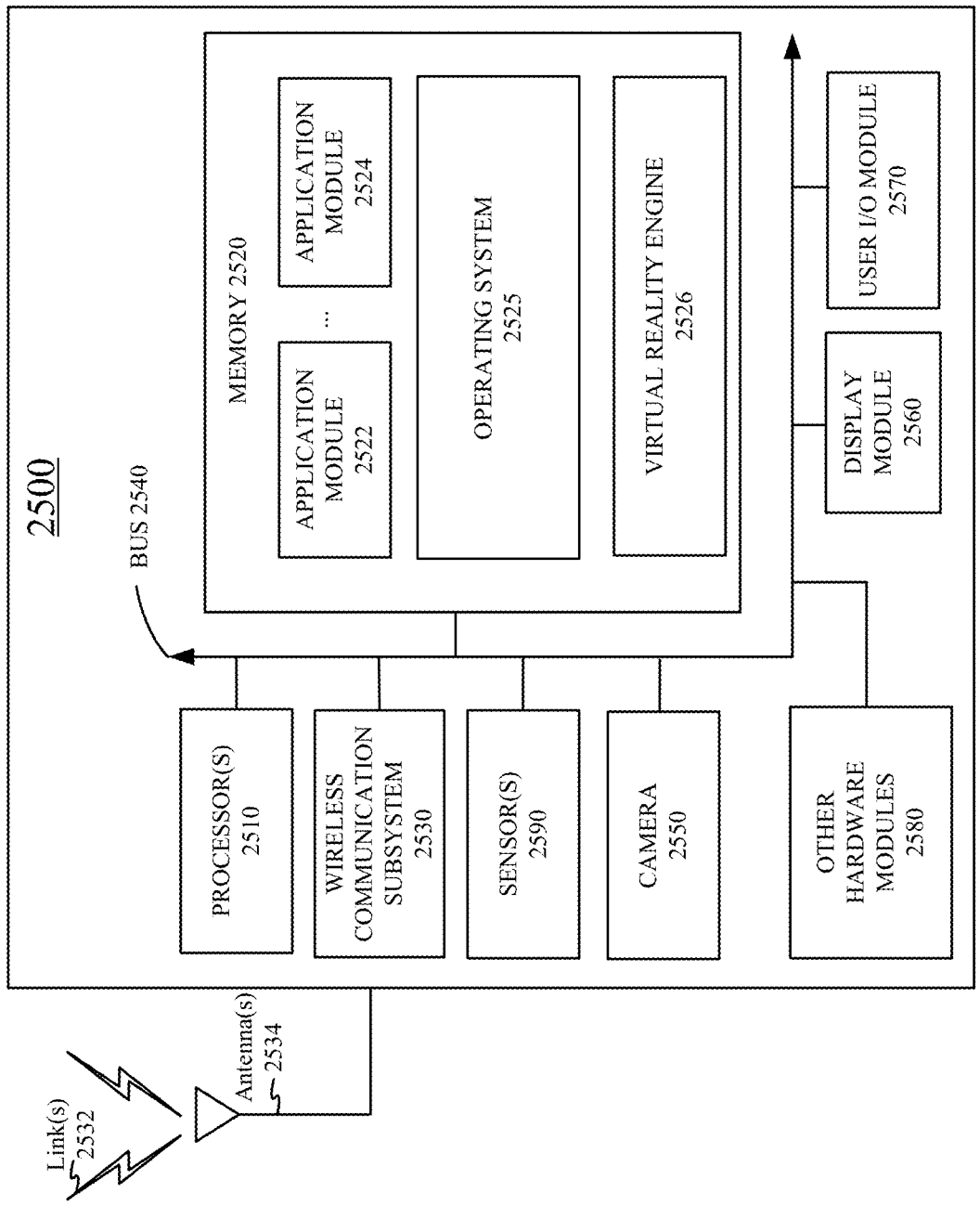
FIG. 25 is a simplified block diagram of an electronic system of an example of a near-eye display according to certain embodiments.

FIG. 25 is a simplified block diagram of an example electronic system 2500 of an example near-eye display (e.g., HMD device) for implementing some of the examples disclosed herein. Electronic system 2500 may be used as the electronic system of an HMD device or other near-eye displays described above. In this example, electronic system 2500 may include one or more processor(s) 2510 and a memory 2520. Processor(s) 2510 may be configured to execute instructions for performing operations at a number of components, and can be, for example, a general-purpose processor or microprocessor suitable for implementation within a portable electronic device. Processor(s) 2510 may be communicatively coupled with a plurality of components within electronic system 2500. To realize this communicative coupling, processor(s) 2510 may communicate with the other illustrated components across a bus 2540. Bus 2540 may be any subsystem adapted to transfer data within electronic system 2500. Bus 2540 may include a plurality of computer buses and additional circuitry to transfer data.

Memory 2520 may be coupled to processor(s) 2510. In some embodiments, memory 2520 may offer both short-term and long-term storage and may be divided into several units. Memory 2520 may be volatile, such as static random access memory (SRAM) and/or dynamic random access memory (DRAM) and/or non-volatile, such as read-only memory (ROM), flash memory, and the like. Furthermore, memory 2520 may include removable storage devices, such as secure digital (SD) cards. Memory 2520 may provide storage of computer-readable instructions, data structures, program modules, and other data for electronic system 2500. In some embodiments, memory 2520 may be distributed into different hardware modules. A set of instructions and/or code might be stored on memory 2520. The instructions might take the form of executable code that may be executable by electronic system 2500, and/or might take the form of source and/or installable code, which, upon compilation and/or installation on electronic system 2500 (e.g., using any of a variety of generally available compilers, installation programs, compression/decompression utilities, etc.), may take the form of executable code.

In some embodiments, memory 2520 may store a plurality of application modules 2522 through 2524, which may include any number of applications. Examples of applications may include gaming applications, conferencing applications, video playback applications, or other suitable applications. The applications may include a depth sensing function or eye tracking function. Application modules 2522-2524 may include particular instructions to be executed by processor(s) 2510. In some embodiments, certain applications or parts of application modules 2522-2524 may be executable by other hardware modules 2580. In certain embodiments, memory 2520 may additionally include secure memory, which may include additional security controls to prevent copying or other unauthorized access to secure information.

In some embodiments, memory 2520 may include an operating system 2525 loaded therein. Operating system 2525 may be operable to initiate the execution of the instructions provided by application modules 2522-2524 and/or manage other hardware modules 2580 as well as interfaces with a wireless communication subsystem 2530 which may include one or more wireless transceivers. Operating system 2525 may be adapted to perform other operations across the components of electronic system 2500 including threading, resource management, data storage control and other similar functionality.

Wireless communication subsystem 2530 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2500 may include one or more antennas 2534 for wireless communication as part of wireless communication subsystem 2530 or as a separate component coupled to any portion of the system. Depending on desired functionality, wireless communication subsystem 2530 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2530 may permit data to be exchanged with a network, other computer systems, and/or any other devices described herein. Wireless communication subsystem 2530 may include a means for transmitting or receiving data, such as identifiers of HMD devices, position data, a geographic map, a heat map, photos, or videos, using antenna(s) 2534 and wireless link(s) 2532. Wireless communication subsystem 2530, processor(s) 2510, and memory 2520 may together comprise at least a part of one or more of a means for performing some functions disclosed herein.

Embodiments of electronic system 2500 may also include one or more sensors 2590. Sensor(s) 2590 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2590 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 2500 may include a display module 2560. Display module 2560 may be a near-eye display, and may graphically present information, such as images, videos, and various instructions, from electronic system 2500 to a user. Such information may be derived from one or more application modules 2522-2524, virtual reality engine 2526, one or more other hardware modules 2580, a combination thereof, or any other suitable means for resolving graphical content for the user (e.g., by operating system 2525). Display module 2560 may use LCD technology, LED technology (including, for example, OLED, ILED, μ-LED, AMOLED, TOLED, etc.), light emitting polymer display (LPD) technology, VCSELs, or some other display technology.

Electronic system 2500 may include a user input/output module 2570. User input/output module 2570 may allow a user to send action requests to electronic system 2500. An action request may be a request to perform a particular action. For example, an action request may be to start or end an application or to perform a particular action within the application. User input/output module 2570 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2500. In some embodiments, user input/output module 2570 may provide haptic feedback to the user in accordance with instructions received from electronic system 2500. For example, the haptic feedback may be provided when an action request is received or has been performed.

Electronic system 2500 may include a camera 2550 that may be used to take photos or videos of a user, for example, for tracking the user's eye position. Camera 2550 may also be used to take photos or videos of the environment, for example, for VR, AR, or MR applications. Camera 2550 may include, for example, a complementary metal-oxide-semiconductor (CMOS) image sensor with a few millions or tens of millions of pixels. In some implementations, camera 2550 may include two or more cameras that may be used to capture 3-D images.

In some embodiments, electronic system 2500 may include a plurality of other hardware modules 2580. Each of other hardware modules 2580 may be a physical module within electronic system 2500. While each of other hardware modules 2580 may be permanently configured as a structure, some of other hardware modules 2580 may be temporarily configured to perform specific functions or temporarily activated. Examples of other hardware modules 2580 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2580 may be implemented in software.

In some embodiments, memory 2520 of electronic system 2500 may also store a virtual reality engine 2526. Virtual reality engine 2526 may execute applications within electronic system 2500 and receive position information, acceleration information, velocity information, predicted future positions, or any combination thereof of the HMD device from the various sensors. In some embodiments, the information received by virtual reality engine 2526 may be used for producing a signal (e.g., display instructions) to display module 2560. For example, if the received information indicates that the user has looked to the left, virtual reality engine 2526 may generate content for the HMD device that mirrors the user's movement in a virtual environment. Additionally, virtual reality engine 2526 may perform an action within an application in response to an action request received from user input/output module 2570 and provide feedback to the user. The provided feedback may be visual, audible, or haptic feedback. In some implementations, processor(s) 2510 may include one or more GPUs that may execute virtual reality engine 2526.

In various implementations, the above-described hardware and modules may be implemented on a single device or on multiple devices that can communicate with one another using wired or wireless connections. For example, in some implementations, some components or modules, such as GPUs, virtual reality engine 2526, and applications (e.g., tracking application), may be implemented on a console separate from the head-mounted display device. In some implementations, one console may be connected to or support more than one HMD.

In alternative configurations, different and/or additional components may be included in electronic system 2500. Similarly, functionality of one or more of the components can be distributed among the components in a manner different from the manner described above. For example, in some embodiments, electronic system 2500 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A semiconductor light source comprising:
a substrate; a resonant cavity including a first mirror and a second mirror, the first mirror and the second mirror each including a respective set of semiconductor layers, wherein the resonant cavity is on the substrate; a semiconductor light emitting region in the resonant cavity and configured to emit infrared light; a third mirror between the resonant cavity and the substrate, having an area larger than the second mirror;
a planar lens including a plurality of semiconductor layers and configured to focus the infrared light emitted from the semiconductor light emitting, wherein the planar lens is between the first mirror and the second mirror;
a nonlinear crystal configured to convert the infrared light focused by the planar lens into visible light through second harmonic generation, wherein the planar lens and the nonlinear crystal are positioned such that the planar lens focuses the infrared light emitted from the semiconductor light emitting region into an area of the nonlinear crystal to increase a light intensity at the area of the nonlinear crystal; and
a selective reflection layer on the nonlinear crystal and configured to:
reflect the infrared light back into the resonant cavity to form an external cavity; and
transmit the visible light out of the semiconductor light source.

2. The semiconductor light source of claim 1, wherein:
each semiconductor layer of the plurality of semiconductor layers includes a first lateral region and a second lateral region, the first lateral region and the second lateral region characterized by different respective refractive indices; and
the first lateral region in each semiconductor layer of the plurality of semiconductor layers is characterized by a different lateral dimension.

3. The semiconductor light source of claim 2, wherein the first lateral region in each semiconductor layer of the plurality of semiconductor layers includes a first semiconductor material with a different respective composition.

4. The semiconductor light source of claim 3, wherein the first semiconductor material with the different respective composition in each semiconductor layer of the plurality of semiconductor layers is characterized by a different respective lateral oxidation rate or lateral etch rate.

5. The semiconductor light source of claim 3, wherein the first lateral region in each semiconductor layer of the plurality of semiconductor layers includes $Al_xGa_{1-x}As$ and is characterized by a different respective x value that is greater than 0.7.

6. The semiconductor light source of claim 3, wherein the first lateral region in each semiconductor layer of the plurality of semiconductor layers includes $(Al_xGa_{1-x})_{0.5}In_{0.5}P$ and is characterized by a different respective x value.

7. The semiconductor light source of claim 2, wherein:
the second lateral region includes an oxide region, an air gap, or a filling material; and
the first lateral region includes an unoxidized semiconductor region.

8. The semiconductor light source of claim 2, wherein the plurality of semiconductor layers are in adjacent epitaxial layers.

9. The semiconductor light source of claim 2, wherein the plurality of semiconductor layers are interleaved with a plurality of interlayers, the plurality of interlayers including a second semiconductor material.

10. The semiconductor light source of claim 9, wherein the plurality of semiconductor layers and the plurality of interlayers form an antireflection structure.

11. The semiconductor light source of claim 1, wherein:
the first mirror includes a first distributed Bragg reflector characterized by a first reflectivity; and
the second mirror includes a second distributed Bragg reflector characterized by a second reflectivity lower than the first reflectivity.

12. The semiconductor light source of claim 1, wherein the nonlinear crystal includes $LiNbO_3$, $KNbO_3$, KTP, BBO, KDP, LBO, KTO, or BTO.

13. The semiconductor light source of claim 1, wherein the resonant cavity and the semiconductor light emitting region in the resonant cavity form a mode-locked laser.

14. The semiconductor light source of claim 1, wherein the semiconductor light emitting region comprises:
a first cladding layer;
a second cladding layer; and
a light emission layer between the first cladding layer and the second cladding layer.

15. The semiconductor light source of claim 14, wherein the light emission layer includes a quantum dot structure, a quantum well structure, or a multiple-quantum-well structure.

16. The semiconductor light source of claim 1, further comprising a micro-lens on the selective reflection layer.

17. A visible light source including an array of semiconductor light sources, each semiconductor light source in the array of semiconductor light sources comprising:
a substrate; a first set of semiconductor layers forming a first mirror; and a second set of semiconductor layers forming a second mirror, the second mirror and the first mirror forming a resonant cavity, wherein the resonant cavity is on the substrate; a light emitting region positioned between the first set of semiconductor layers and the second set of semiconductor layers and configured to emit light in a first wavelength; a third mirror between the resonant cavity and the substrate, having an area larger than the second mirror;
a nonlinear crystal configured to convert the light in the first wavelength and focused by the planar lens into light in a second wavelength that is a half of the first wavelength, wherein the planar lens and the nonlinear crystal are positioned such that the planar lens focuses the light in the first wavelength emitted by the light emitting region into an area of the nonlinear crystal to increase a light intensity at the area of the nonlinear crystal; and
a selective reflection layer on the nonlinear crystal and configured to:
reflect the light in the first wavelength back into the resonant cavity to form an external cavity; and
transmit the light in the second wavelength out of the semiconductor light source.

* * * * *